(12) United States Patent
Kim et al.

(10) Patent No.: US 8,895,214 B2
(45) Date of Patent: Nov. 25, 2014

(54) OPTICAL MASK FOR FORMING PATTERN

(71) Applicant: Samsung Display Co., Ltd., Yongin (KR)

(72) Inventors: Bong-Yeon Kim, Seoul (KR); Min Kang, Seoul (KR); Jeong Won Kim, Seoul (KR); Jin Ho Ju, Seoul (KR); Jun Hyuk Woo, Yongin-si (KR); Hyun Joo Lee, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/180,234

(22) Filed: Feb. 13, 2014

(65) Prior Publication Data

US 2014/0162177 A1  Jun. 12, 2014

Related U.S. Application Data

(63) Continuation of application No. 13/779,482, filed on Feb. 27, 2013, now Pat. No. 8,691,479.

(30) Foreign Application Priority Data

Nov. 5, 2012 (KR) .......................... 10-2012-0124013

(51) Int. Cl.
  *G03F 1/32* (2012.01)
(52) U.S. Cl.
  CPC ...................................... *G03F 1/32* (2013.01)
  USPC ................................................................ 430/5
(58) Field of Classification Search
  CPC ........................................................ G03F 1/32
  USPC ................................................................ 430/5
  See application file for complete search history.

(56) References Cited

U.S. PATENT DOCUMENTS 6,656,644 B2  12/2003  Hasegawa et al.
6,846,598 B2  1/2005  Mori et al.

FOREIGN PATENT DOCUMENTS

| JP | 2010-175597 | 8/2010 |
|---|---|---|
| KR | 10-2005-0031952 | 4/2005 |
| KR | 10-2006-0006541 | 1/2006 |
| KR | 10-2010-0109771 | 10/2010 |
| KR | 10-2011-0074175 | 6/2011 |
| KR | 10-2012-0057488 | 6/2012 |
| KR | 10-2012-0057502 | 6/2012 |

*Primary Examiner* — Christopher Young
(74) *Attorney, Agent, or Firm* — Innovation Counsel LLP

(57) ABSTRACT

An optical mask for forming a pattern is provided. The optical mask includes: a substrate including a light blocking pattern formed on portions of the substrate, wherein the light blocking pattern includes a halftone layer and a light blocking layer formed on the halftone layer, and the halftone layer and the light blocking layer overlap such that at least an edge portion of the halftone layer is exposed. A pitch of the light blocking pattern may about 6 µm, and a transmission ratio of the halftone layer may range from about 10% to about 50%.

19 Claims, 24 Drawing Sheets

FIG. 7A

| NILS | RIM Transmission 10% | | | | | | | | | | | |
|---|---|---|---|---|---|---|---|---|---|---|---|---|
| | Line Width | BIM | \multicolumn{10}{c}{RIM Size(um)} |
| | | | 0.1 | 0.2 | 0.3 | 0.4 | 0.5 | 0.6 | 0.7 | 0.8 | 0.9 | 1 |
| 6um Pitch | 2.0 | 2.242 | 2.168 | 2.088 | 2.002 | 1.911 | 1.814 | 1.715 | 1.612 | 1.507 | 1.402 | 1.298 |
| | 2.1 | 2.402 | 2.330 | 2.251 | 2.167 | 2.078 | 1.982 | 1.883 | 1.780 | 1.674 | 1.567 | 1.460 |
| | 2.2 | 2.552 | 2.481 | 2.404 | 2.322 | 2.235 | 2.142 | 2.044 | 1.942 | 1.837 | 1.729 | 1.620 |
| | 2.3 | 2.691 | 2.622 | 2.547 | 2.467 | 2.381 | 2.291 | 2.195 | 2.096 | 1.992 | 1.885 | 1.776 |
| | 2.4 | 2.822 | 2.753 | 2.680 | 2.602 | 2.519 | 2.431 | 2.338 | 2.241 | 2.140 | 2.034 | 1.926 |
| | 2.5 | 2.945 | 2.877 | 2.805 | 2.729 | 2.647 | 2.562 | 2.472 | 2.377 | 2.279 | 2.177 | 2.070 |
| | 2.6 | 3.060 | 2.993 | 2.922 | 2.847 | 2.767 | 2.684 | 2.597 | 2.505 | 2.409 | 2.310 | 2.207 |
| | 2.7 | 3.169 | 3.102 | 3.032 | 2.957 | 2.879 | 2.798 | 2.712 | 2.624 | 2.531 | 2.435 | 2.335 |
| | 2.8 | 3.271 | 3.205 | 3.135 | 3.061 | 2.984 | 2.904 | 2.820 | 2.734 | 2.644 | 2.551 | 2.455 |
| | 2.9 | 3.367 | 3.302 | 3.232 | 3.158 | 3.082 | 3.003 | 2.921 | 2.836 | 2.749 | 2.659 | 2.566 |
| | 3.0 | 3.457 | 3.392 | 3.323 | 3.250 | 3.173 | 3.095 | 3.014 | 2.931 | 2.846 | 2.759 | 2.668 |
| | 3.1 | 3.540 | 3.475 | 3.406 | 3.334 | 3.258 | 3.180 | 3.100 | 3.018 | 2.935 | 2.850 | 2.762 |
| | 3.2 | 3.624 | 3.550 | 3.481 | 3.410 | 3.334 | 3.257 | 3.178 | 3.097 | 3.015 | 2.931 | 2.846 |
| | 3.3 | 3.677 | | 3.547 | 3.476 | 3.402 | 3.324 | 3.246 | 3.166 | 3.085 | 3.003 | 2.920 |
| | 3.4 | 3.728 | | 3.602 | 3.532 | 3.459 | 3.382 | 3.304 | 3.225 | 3.145 | 3.064 | 2.983 |
| | 3.5 | 3.768 | | | 3.577 | 3.505 | 3.430 | 3.352 | 3.274 | 3.195 | 3.115 | 3.035 |
| | 3.6 | 3.795 | | | 3.611 | 3.540 | 3.467 | 3.390 | 3.312 | 3.234 | 3.155 | 3.076 |
| | 3.7 | 3.807 | | | | 3.562 | 3.490 | 3.416 | 3.339 | 3.261 | 3.183 | 3.105 |
| | 3.8 | 3.803 | | | | 3.570 | 3.500 | 3.427 | 3.352 | 3.275 | 3.198 | 3.121 |
| | 3.9 | 3.784 | | | | 3.563 | 3.495 | 3.424 | 3.351 | 3.275 | 3.200 | 3.124 |
| | 4.0 | 3.747 | | | | 3.541 | 3.475 | 3.406 | 3.335 | 3.262 | 3.187 | 3.112 |

FIG. 7B

| Edge Intensity | RIM Transmission 10% | | RIM Size(um) | | | | | | | | | |
|---|---|---|---|---|---|---|---|---|---|---|---|---|
| | Line Width | BIM | 0.1 | 0.2 | 0.3 | 0.4 | 0.5 | 0.6 | 0.7 | 0.8 | 0.9 | 1 |
| 6um Pitch | 2.0 | 0.327 | 0.340 | 0.354 | 0.367 | 0.382 | 0.396 | 0.411 | 0.427 | 0.443 | 0.460 | 0.477 |
| | 2.1 | 0.325 | 0.338 | 0.351 | 0.364 | 0.377 | 0.391 | 0.405 | 0.419 | 0.434 | 0.450 | 0.466 |
| | 2.2 | 0.325 | 0.337 | 0.349 | 0.362 | 0.375 | 0.387 | 0.401 | 0.414 | 0.428 | 0.442 | 0.456 |
| | 2.3 | 0.324 | 0.336 | 0.348 | 0.361 | 0.373 | 0.385 | 0.397 | 0.410 | 0.423 | 0.436 | 0.449 |
| | 2.4 | 0.324 | 0.336 | 0.348 | 0.360 | 0.372 | 0.383 | 0.395 | 0.407 | 0.419 | 0.431 | 0.443 |
| | 2.5 | 0.325 | 0.337 | 0.348 | 0.360 | 0.371 | 0.383 | 0.394 | 0.405 | 0.416 | 0.427 | 0.438 |
| | 2.6 | 0.325 | 0.337 | 0.349 | 0.360 | 0.371 | 0.382 | 0.393 | 0.404 | 0.414 | 0.425 | 0.435 |
| | 2.7 | 0.326 | 0.338 | 0.349 | 0.360 | 0.371 | 0.382 | 0.393 | 0.403 | 0.413 | 0.423 | 0.433 |
| | 2.8 | 0.326 | 0.338 | 0.350 | 0.361 | 0.372 | 0.382 | 0.393 | 0.403 | 0.413 | 0.422 | 0.431 |
| | 2.9 | 0.327 | 0.338 | 0.350 | 0.361 | 0.372 | 0.383 | 0.393 | 0.402 | 0.412 | 0.421 | 0.429 |
| | 3.0 | 0.327 | 0.339 | 0.350 | 0.361 | 0.372 | 0.383 | 0.393 | 0.402 | 0.412 | 0.420 | 0.428 |
| | 3.1 | 0.326 | 0.338 | 0.350 | 0.361 | 0.372 | 0.382 | 0.392 | 0.402 | 0.411 | 0.420 | 0.427 |
| | 3.2 | 0.326 | 0.338 | 0.349 | 0.360 | 0.371 | 0.382 | 0.392 | 0.401 | 0.411 | 0.419 | 0.426 |
| | 3.3 | 0.324 | 0.338 | 0.347 | 0.359 | 0.370 | 0.380 | 0.390 | 0.400 | 0.410 | 0.418 | 0.425 |
| | 3.4 | 0.322 | | | | 0.368 | 0.378 | 0.388 | 0.398 | 0.408 | 0.416 | 0.424 |
| | 3.5 | 0.319 | | | 0.356 | 0.365 | 0.376 | 0.386 | 0.395 | 0.406 | 0.414 | 0.422 |
| | 3.6 | 0.315 | | | 0.353 | 0.361 | 0.372 | 0.382 | 0.392 | 0.404 | 0.412 | 0.419 |
| | 3.7 | 0.310 | | | | 0.356 | 0.367 | 0.377 | 0.387 | 0.400 | 0.409 | 0.416 |
| | 3.8 | 0.304 | | | | 0.349 | 0.361 | 0.372 | 0.381 | 0.396 | 0.404 | 0.412 |
| | 3.9 | 0.297 | | | | 0.342 | 0.354 | 0.364 | 0.374 | 0.391 | 0.399 | 0.406 |
| | 4.0 | 0.288 | | | | | | | | 0.384 | 0.392 | 0.400 |

FIG. 8A

| NILS | RIM Transmission 20% | | RIM Size (um) | | | | | | | | | |
|---|---|---|---|---|---|---|---|---|---|---|---|---|
| | Line Width | BIM | 0.1 | 0.2 | 0.3 | 0.4 | 0.5 | 0.6 | 0.7 | 0.8 | 0.9 | 1 |
| 6um pitch | 2.0 | 2.242 | 2.138 | 2.026 | 1.907 | 1.781 | 1.650 | 1.516 | 1.378 | 1.240 | 1.104 | 0.971 |
| | 2.1 | 2.402 | 2.300 | 2.191 | 2.074 | 1.950 | 1.819 | 1.684 | 1.545 | 1.404 | 1.263 | 1.123 |
| | 2.2 | 2.552 | 2.452 | 2.345 | 2.230 | 2.109 | 1.981 | 1.846 | 1.708 | 1.565 | 1.421 | 1.278 |
| | 2.3 | 2.691 | 2.593 | 2.489 | 2.377 | 2.258 | 2.133 | 2.001 | 1.864 | 1.723 | 1.577 | 1.431 |
| | 2.4 | 2.822 | 2.725 | 2.623 | 2.514 | 2.398 | 2.276 | 2.147 | 2.013 | 1.873 | 1.729 | 1.582 |
| | 2.5 | 2.945 | 2.849 | 2.749 | 2.642 | 2.528 | 2.409 | 2.284 | 2.153 | 2.017 | 1.875 | 1.729 |
| | 2.6 | 3.060 | 2.966 | 2.866 | 2.761 | 2.650 | 2.534 | 2.412 | 2.285 | 2.151 | 2.014 | 1.871 |
| | 2.7 | 3.169 | 3.075 | 2.976 | 2.872 | 2.764 | 2.650 | 2.531 | 2.407 | 2.278 | 2.143 | 2.004 |
| | 2.8 | 3.271 | 3.178 | 3.080 | 2.977 | 2.870 | 2.758 | 2.641 | 2.521 | 2.395 | 2.265 | 2.129 |
| | 2.9 | 3.367 | 3.275 | 3.177 | 3.074 | 2.968 | 2.858 | 2.744 | 2.626 | 2.504 | 2.377 | 2.246 |
| | 3.0 | 3.457 | 3.365 | 3.268 | 3.166 | 3.060 | 2.951 | 2.839 | 2.723 | 2.604 | 2.481 | 2.354 |
| | 3.1 | 3.540 | 3.449 | 3.352 | 3.251 | 3.146 | 3.038 | 2.927 | 2.812 | 2.696 | 2.576 | 2.452 |
| | 3.2 | 3.614 | 3.524 | 3.428 | 3.328 | 3.223 | 3.116 | 3.006 | 2.893 | 2.778 | 2.661 | 2.541 |
| | 3.3 | 3.677 | 3.589 | 3.494 | 3.396 | 3.293 | 3.185 | 3.076 | 2.966 | 2.852 | 2.737 | 2.620 |
| | 3.4 | 3.728 | 3.641 | 3.551 | 3.453 | 3.352 | 3.246 | 3.138 | 3.028 | 2.916 | 2.803 | 2.688 |
| | 3.5 | 3.768 | 3.683 | 3.597 | 3.501 | 3.401 | 3.297 | 3.189 | 3.081 | 2.971 | 2.859 | 2.746 |
| | 3.6 | 3.795 | 3.714 | 3.627 | 3.538 | 3.439 | 3.338 | 3.232 | 3.124 | 3.015 | 2.905 | 2.794 |
| | 3.7 | 3.807 | 3.735 | 3.647 | 3.562 | 3.465 | 3.366 | 3.263 | 3.156 | 3.049 | 2.940 | 2.830 |
| | 3.8 | 3.803 | 3.740 | 3.656 | 3.571 | 3.478 | 3.381 | 3.280 | 3.176 | 3.070 | 2.963 | 2.855 |
| | 3.9 | 3.784 | 3.729 | 3.651 | 3.564 | 3.477 | 3.382 | 3.284 | 3.183 | 3.078 | 2.973 | 2.868 |
| | 4.0 | 3.747 | 3.701 | 3.632 | 3.543 | 3.460 | 3.370 | 3.274 | 3.176 | 3.074 | 2.971 | 2.867 |

FIG. 8B

| Edge Intensity | RIM Transmission 20% | | RIM Size (μm) | | | | | | | | | |
|---|---|---|---|---|---|---|---|---|---|---|---|---|
| | Line Width | BIM | 0.1 | 0.2 | 0.3 | 0.4 | 0.5 | 0.6 | 0.7 | 0.8 | 0.9 | 1 |
| 6μm Pitch | 2.0 | 0.327 | 0.346 | 0.365 | 0.385 | 0.406 | 0.428 | 0.451 | 0.476 | 0.501 | 0.528 | 0.556 |
| | 2.1 | 0.325 | 0.343 | 0.362 | 0.381 | 0.401 | 0.422 | 0.443 | 0.465 | 0.489 | 0.514 | 0.540 |
| | 2.2 | 0.325 | 0.342 | 0.360 | 0.378 | 0.397 | 0.417 | 0.437 | 0.458 | 0.479 | 0.502 | 0.526 |
| | 2.3 | 0.324 | 0.341 | 0.359 | 0.377 | 0.395 | 0.413 | 0.432 | 0.451 | 0.471 | 0.492 | 0.514 |
| | 2.4 | 0.324 | 0.341 | 0.358 | 0.376 | 0.393 | 0.411 | 0.429 | 0.447 | 0.465 | 0.485 | 0.505 |
| | 2.5 | 0.325 | 0.342 | 0.358 | 0.375 | 0.392 | 0.409 | 0.426 | 0.443 | 0.461 | 0.479 | 0.497 |
| | 2.6 | 0.325 | 0.342 | 0.359 | 0.375 | 0.392 | 0.408 | 0.425 | 0.441 | 0.458 | 0.474 | 0.491 |
| | 2.7 | 0.326 | 0.342 | 0.359 | 0.376 | 0.392 | 0.408 | 0.424 | 0.440 | 0.455 | 0.471 | 0.487 |
| | 2.8 | 0.326 | 0.343 | 0.359 | 0.376 | 0.392 | 0.408 | 0.423 | 0.439 | 0.454 | 0.468 | 0.483 |
| | 2.9 | 0.327 | 0.343 | 0.360 | 0.376 | 0.392 | 0.408 | 0.423 | 0.438 | 0.453 | 0.467 | 0.481 |
| | 3.0 | 0.327 | 0.344 | 0.360 | 0.377 | 0.393 | 0.408 | 0.423 | 0.438 | 0.452 | 0.465 | 0.479 |
| | 3.1 | 0.326 | 0.343 | 0.360 | 0.377 | 0.393 | 0.408 | 0.423 | 0.437 | 0.451 | 0.464 | 0.477 |
| | 3.2 | 0.326 | 0.343 | 0.360 | 0.376 | 0.392 | 0.408 | 0.423 | 0.437 | 0.451 | 0.464 | 0.476 |
| | 3.3 | 0.324 | 0.342 | 0.359 | 0.376 | 0.392 | 0.407 | 0.422 | 0.436 | 0.450 | 0.463 | 0.475 |
| | 3.4 | 0.322 | | 0.358 | 0.375 | 0.391 | 0.405 | 0.420 | 0.434 | 0.449 | 0.462 | 0.473 |
| | 3.5 | 0.319 | | 0.355 | 0.373 | 0.389 | 0.403 | 0.418 | 0.432 | 0.448 | 0.460 | 0.472 |
| | 3.6 | 0.315 | | | 0.370 | 0.387 | 0.400 | 0.415 | 0.429 | 0.446 | 0.458 | 0.470 |
| | 3.7 | 0.310 | | | 0.366 | 0.383 | 0.395 | 0.411 | 0.426 | 0.443 | 0.456 | 0.467 |
| | 3.8 | 0.304 | | | 0.361 | 0.379 | 0.390 | 0.406 | 0.421 | 0.439 | 0.452 | 0.464 |
| | 3.9 | 0.297 | | | 0.355 | 0.373 | 0.383 | 0.400 | 0.415 | 0.435 | 0.448 | 0.459 |
| | 4.0 | 0.288 | | | 0.348 | 0.366 | | | | 0.429 | 0.442 | 0.454 |

FIG. 9A

| NILS | RIM Transmission 30% | | | | | | | | | | | |
|---|---|---|---|---|---|---|---|---|---|---|---|---|
| | Line Width | BIM | \multicolumn{11}{c}{RIM Size (um)} |
| | | | 0.1 | 0.2 | 0.3 | 0.4 | 0.5 | 0.6 | 0.7 | 0.8 | 0.9 | 1 |
| 6um Pitch | 2.0 | 2.242 | 2.115 | 1.979 | 1.836 | 1.686 | 1.530 | 1.372 | 1.212 | 1.053 | 0.898 | 0.748 |
| | 2.1 | 2.402 | 2.278 | 2.145 | 2.004 | 1.855 | 1.699 | 1.539 | 1.376 | 1.212 | 1.049 | 0.891 |
| | 2.2 | 2.552 | 2.430 | 2.300 | 2.161 | 2.015 | 1.862 | 1.702 | 1.538 | 1.371 | 1.203 | 1.039 |
| | 2.3 | 2.691 | 2.572 | 2.445 | 2.309 | 2.166 | 2.016 | 1.858 | 1.695 | 1.528 | 1.358 | 1.188 |
| | 2.4 | 2.822 | 2.704 | 2.580 | 2.447 | 2.307 | 2.160 | 2.006 | 1.845 | 1.680 | 1.510 | 1.338 |
| | 2.5 | 2.945 | 2.828 | 2.706 | 2.576 | 2.439 | 2.296 | 2.146 | 1.988 | 1.825 | 1.657 | 1.485 |
| | 2.6 | 3.060 | 2.945 | 2.823 | 2.696 | 2.562 | 2.422 | 2.276 | 2.122 | 1.962 | 1.798 | 1.628 |
| | 2.7 | 3.169 | 3.055 | 2.934 | 2.808 | 2.677 | 2.539 | 2.396 | 2.247 | 2.091 | 1.930 | 1.764 |
| | 2.8 | 3.271 | 3.158 | 3.038 | 2.913 | 2.784 | 2.649 | 2.508 | 2.363 | 2.212 | 2.055 | 1.893 |
| | 2.9 | 3.367 | 3.254 | 3.136 | 3.011 | 2.883 | 2.750 | 2.612 | 2.470 | 2.323 | 2.170 | 2.012 |
| | 3.0 | 3.457 | 3.345 | 3.227 | 3.103 | 2.976 | 2.845 | 2.709 | 2.569 | 2.426 | 2.277 | 2.124 |
| | 3.1 | 3.540 | 3.428 | 3.311 | 3.189 | 3.062 | 2.931 | 2.798 | 2.660 | 2.520 | 2.375 | 2.226 |
| | 3.2 | 3.614 | 3.504 | 3.387 | 3.266 | 3.140 | 3.010 | 2.879 | 2.743 | 2.605 | 2.463 | 2.318 |
| | 3.3 | 3.677 | 3.570 | 3.455 | 3.335 | 3.211 | 3.082 | 2.951 | 2.817 | 2.681 | 2.542 | 2.401 |
| | 3.4 | 3.728 | | 3.513 | 3.394 | 3.272 | 3.145 | 3.014 | 2.882 | 2.748 | 2.611 | 2.473 |
| | 3.5 | 3.768 | | 3.560 | 3.444 | 3.323 | 3.198 | 3.069 | 2.938 | 2.806 | 2.671 | 2.536 |
| | 3.6 | 3.795 | | 3.595 | 3.483 | 3.364 | 3.242 | 3.115 | 2.985 | 2.854 | 2.722 | 2.588 |
| | 3.7 | 3.807 | | | 3.509 | 3.393 | 3.274 | 3.150 | 3.021 | 2.892 | 2.762 | 2.630 |
| | 3.8 | 3.803 | | | 3.521 | 3.410 | 3.293 | 3.172 | 3.047 | 2.919 | 2.791 | 2.662 |
| | 3.9 | 3.784 | | | 3.518 | 3.413 | 3.299 | 3.181 | 3.060 | 2.935 | 2.808 | 2.682 |
| | 4.0 | 3.747 | | | 3.500 | 3.400 | 3.292 | 3.177 | 3.060 | 2.938 | 2.814 | 2.689 |

FIG. 9B

| Edge Intensity | RIM Transmission 30% | | RIM Size (μm) | | | | | | | | | |
|---|---|---|---|---|---|---|---|---|---|---|---|---|
| | Line Width | BIM | 0.1 | 0.2 | 0.3 | 0.4 | 0.5 | 0.6 | 0.7 | 0.8 | 0.9 | 1 |
| 6um Pitch | 2.0 | 0.327 | 0.350 | 0.374 | 0.400 | 0.426 | 0.455 | 0.484 | 0.516 | 0.550 | 0.586 | 0.624 |
| | 2.1 | 0.325 | 0.348 | 0.371 | 0.395 | 0.420 | 0.447 | 0.474 | 0.504 | 0.535 | 0.568 | 0.602 |
| | 2.2 | 0.325 | 0.346 | 0.368 | 0.392 | 0.416 | 0.440 | 0.466 | 0.494 | 0.522 | 0.553 | 0.585 |
| | 2.3 | 0.324 | 0.345 | 0.367 | 0.389 | 0.412 | 0.436 | 0.460 | 0.486 | 0.512 | 0.540 | 0.569 |
| | 2.4 | 0.324 | 0.345 | 0.366 | 0.388 | 0.410 | 0.433 | 0.456 | 0.480 | 0.504 | 0.530 | 0.557 |
| | 2.5 | 0.325 | 0.345 | 0.366 | 0.387 | 0.409 | 0.431 | 0.453 | 0.475 | 0.498 | 0.522 | 0.547 |
| | 2.6 | 0.325 | 0.346 | 0.367 | 0.387 | 0.408 | 0.429 | 0.450 | 0.472 | 0.494 | 0.516 | 0.539 |
| | 2.7 | 0.326 | 0.346 | 0.367 | 0.388 | 0.408 | 0.429 | 0.449 | 0.470 | 0.490 | 0.511 | 0.533 |
| | 2.8 | 0.326 | 0.347 | 0.367 | 0.388 | 0.408 | 0.428 | 0.448 | 0.468 | 0.488 | 0.508 | 0.528 |
| | 2.9 | 0.327 | 0.347 | 0.368 | 0.388 | 0.409 | 0.428 | 0.448 | 0.467 | 0.486 | 0.505 | 0.524 |
| | 3.0 | 0.327 | 0.347 | 0.368 | 0.389 | 0.409 | 0.429 | 0.448 | 0.467 | 0.485 | 0.503 | 0.521 |
| | 3.1 | 0.326 | 0.347 | 0.368 | 0.389 | 0.409 | 0.429 | 0.448 | 0.466 | 0.484 | 0.502 | 0.519 |
| | 3.2 | 0.326 | 0.347 | 0.368 | 0.389 | 0.409 | 0.429 | 0.448 | 0.466 | 0.484 | 0.501 | 0.517 |
| | 3.3 | 0.324 | 0.346 | 0.367 | 0.388 | 0.409 | 0.428 | 0.447 | 0.466 | 0.483 | 0.500 | 0.516 |
| | 3.4 | 0.322 | | 0.366 | 0.387 | 0.408 | 0.428 | 0.447 | 0.465 | 0.482 | 0.499 | 0.515 |
| | 3.5 | 0.319 | | 0.364 | 0.385 | 0.406 | 0.426 | 0.446 | 0.464 | 0.481 | 0.498 | 0.513 |
| | 3.6 | 0.315 | | 0.361 | 0.383 | 0.404 | 0.424 | 0.444 | 0.462 | 0.480 | 0.496 | 0.511 |
| | 3.7 | 0.310 | | | 0.379 | 0.401 | 0.422 | 0.441 | 0.460 | 0.478 | 0.494 | 0.509 |
| | 3.8 | 0.304 | | | 0.375 | 0.397 | 0.418 | 0.438 | 0.457 | 0.475 | 0.491 | 0.507 |
| | 3.9 | 0.297 | | | 0.369 | 0.392 | 0.413 | 0.434 | 0.453 | 0.471 | 0.488 | 0.503 |
| | 4.0 | 0.288 | | | 0.362 | 0.385 | 0.407 | 0.428 | 0.448 | 0.466 | 0.483 | 0.499 |

FIG. 10A

| NILS | RIM Transmission 40% | | RIM Size (um) | | | | | | | | | |
|---|---|---|---|---|---|---|---|---|---|---|---|---|
| | Line Width | BIM | 0.1 | 0.2 | 0.3 | 0.4 | 0.5 | 0.6 | 0.7 | 0.8 | 0.9 | 1 |
| 6um Pitch | 2.0 | 2.242 | 2.096 | 1.940 | 1.778 | 1.608 | 1.433 | 1.257 | 1.080 | 0.906 | 0.739 | 0.578 |
| | 2.1 | 2.402 | 2.259 | 2.106 | 1.946 | 1.777 | 1.601 | 1.423 | 1.242 | 1.060 | 0.883 | 0.712 |
| | 2.2 | 2.552 | 2.412 | 2.262 | 2.104 | 1.938 | 1.764 | 1.585 | 1.402 | 1.217 | 1.033 | 0.853 |
| | 2.3 | 2.691 | 2.554 | 2.408 | 2.253 | 2.090 | 1.920 | 1.742 | 1.559 | 1.373 | 1.184 | 0.998 |
| | 2.4 | 2.822 | 2.686 | 2.543 | 2.392 | 2.232 | 2.066 | 1.891 | 1.710 | 1.525 | 1.335 | 1.145 |
| | 2.5 | 2.945 | 2.811 | 2.670 | 2.522 | 2.366 | 2.203 | 2.032 | 1.854 | 1.671 | 1.483 | 1.291 |
| | 2.6 | 3.060 | 2.927 | 2.788 | 2.643 | 2.490 | 2.330 | 2.164 | 1.990 | 1.810 | 1.624 | 1.434 |
| | 2.7 | 3.169 | 3.037 | 2.899 | 2.755 | 2.605 | 2.449 | 2.286 | 2.117 | 1.941 | 1.759 | 1.572 |
| | 2.8 | 3.271 | 3.141 | 3.003 | 2.860 | 2.713 | 2.559 | 2.400 | 2.235 | 2.063 | 1.885 | 1.703 |
| | 2.9 | 3.367 | 3.237 | 3.101 | 2.959 | 2.813 | 2.662 | 2.505 | 2.344 | 2.177 | 2.003 | 1.825 |
| | 3.0 | 3.457 | 3.328 | 3.193 | 3.051 | 2.906 | 2.757 | 2.603 | 2.444 | 2.281 | 2.113 | 1.939 |
| | 3.1 | 3.540 | 3.411 | 3.277 | 3.138 | 2.992 | 2.844 | 2.693 | 2.536 | 2.377 | 2.213 | 2.043 |
| | 3.2 | 3.614 | 3.487 | 3.354 | 3.216 | 3.073 | 2.924 | 2.774 | 2.621 | 2.464 | 2.303 | 2.139 |
| | 3.3 | 3.677 | 3.554 | 3.423 | 3.285 | 3.144 | 2.997 | 2.848 | 2.697 | 2.542 | 2.385 | 2.225 |
| | 3.4 | 3.728 | 3.609 | 3.481 | 3.346 | 3.206 | 3.061 | 2.913 | 2.764 | 2.612 | 2.457 | 2.300 |
| | 3.5 | 3.768 | 3.654 | 3.529 | 3.396 | 3.259 | 3.117 | 2.970 | 2.822 | 2.673 | 2.520 | 2.366 |
| | 3.6 | 3.795 | 3.686 | 3.566 | 3.437 | 3.302 | 3.163 | 3.019 | 2.872 | 2.724 | 2.574 | 2.423 |
| | 3.7 | 3.807 | 3.707 | 3.589 | 3.466 | 3.334 | 3.198 | 3.057 | 2.912 | 2.766 | 2.619 | 2.470 |
| | 3.8 | 3.803 | 3.714 | 3.597 | 3.480 | 3.354 | 3.221 | 3.084 | 2.942 | 2.798 | 2.653 | 2.506 |
| | 3.9 | 3.784 | 3.706 | 3.591 | 3.480 | 3.360 | 3.231 | 3.098 | 2.960 | 2.818 | 2.676 | 2.532 |
| | 4.0 | 3.747 | 3.669 | 3.569 | 3.464 | 3.351 | 3.231 | 3.099 | 2.966 | 2.828 | 2.687 | 2.547 |

FIG. 10B

| RIM Transmission 40% | | RIM Size(um) | | | | | | | | | |
|---|---|---|---|---|---|---|---|---|---|---|---|
| Line Width | BIM | 0.1 | 0.2 | 0.3 | 0.4 | 0.5 | 0.6 | 0.7 | 0.8 | 0.9 | 1 |
| 2.0 | 0.327 | 0.354 | 0.382 | 0.412 | 0.444 | 0.478 | 0.514 | 0.553 | 0.594 | 0.638 | 0.685 |
| 2.1 | 0.325 | 0.351 | 0.378 | 0.407 | 0.437 | 0.468 | 0.502 | 0.538 | 0.576 | 0.616 | 0.660 |
| 2.2 | 0.325 | 0.350 | 0.376 | 0.403 | 0.431 | 0.461 | 0.493 | 0.526 | 0.561 | 0.598 | 0.638 |
| 2.3 | 0.324 | 0.349 | 0.374 | 0.400 | 0.428 | 0.456 | 0.485 | 0.516 | 0.549 | 0.583 | 0.620 |
| 2.4 | 0.324 | 0.349 | 0.373 | 0.399 | 0.425 | 0.452 | 0.480 | 0.509 | 0.539 | 0.571 | 0.604 |
| 2.5 | 0.325 | 0.349 | 0.373 | 0.398 | 0.423 | 0.449 | 0.476 | 0.503 | 0.532 | 0.561 | 0.592 |
| 2.6 | 0.325 | 0.349 | 0.373 | 0.398 | 0.423 | 0.448 | 0.473 | 0.499 | 0.526 | 0.553 | 0.582 |
| 2.7 | 0.326 | 0.350 | 0.374 | 0.398 | 0.422 | 0.447 | 0.471 | 0.496 | 0.521 | 0.547 | 0.574 |
| 2.8 | 0.326 | 0.350 | 0.374 | 0.398 | 0.422 | 0.446 | 0.470 | 0.494 | 0.518 | 0.543 | 0.567 |
| 2.9 | 0.327 | 0.351 | 0.375 | 0.399 | 0.423 | 0.446 | 0.470 | 0.493 | 0.516 | 0.539 | 0.563 |
| 3.0 | 0.327 | 0.351 | 0.375 | 0.399 | 0.423 | 0.446 | 0.470 | 0.492 | 0.515 | 0.537 | 0.559 |
| 3.1 | 0.326 | 0.351 | 0.375 | 0.399 | 0.423 | 0.447 | 0.469 | 0.492 | 0.514 | 0.535 | 0.556 |
| 3.2 | 0.326 | 0.350 | 0.375 | 0.399 | 0.423 | 0.447 | 0.469 | 0.492 | 0.513 | 0.534 | 0.554 |
| 3.3 | 0.324 | 0.349 | 0.374 | 0.398 | 0.422 | 0.446 | 0.469 | 0.491 | 0.513 | 0.533 | 0.553 |
| 3.4 | 0.322 | 0.348 | 0.373 | 0.398 | 0.422 | 0.445 | 0.468 | 0.490 | 0.512 | 0.532 | 0.551 |
| 3.5 | 0.319 | | 0.371 | 0.396 | 0.421 | 0.443 | 0.467 | 0.489 | 0.511 | 0.531 | 0.550 |
| 3.6 | 0.315 | | 0.368 | 0.394 | 0.419 | 0.441 | 0.465 | 0.487 | 0.510 | 0.530 | 0.549 |
| 3.7 | 0.310 | | 0.365 | 0.391 | 0.416 | 0.438 | 0.462 | 0.485 | 0.508 | 0.528 | 0.547 |
| 3.8 | 0.304 | | 0.360 | 0.387 | 0.413 | 0.433 | 0.458 | 0.481 | 0.506 | 0.526 | 0.545 |
| 3.9 | 0.297 | | 0.354 | 0.381 | 0.408 | 0.428 | 0.453 | 0.477 | 0.503 | 0.523 | 0.542 |
| 4.0 | 0.288 | | 0.346 | 0.374 | 0.402 | | | | 0.499 | 0.519 | 0.538 |

Edge Intensity

6um Pitch

FIG. 11A

| NILS | RIM Transmission 50% | | RIM Size(um) | | | | | | | | | | |
|---|---|---|---|---|---|---|---|---|---|---|---|---|---|
| | Line Width | BIM | 0.1 | 0.2 | 0.3 | 0.4 | 0.5 | 0.6 | 0.7 | 0.8 | 0.9 | 1 |
| 6um Pitch | 2.0 | 2.242 | 2.079 | 1.907 | 1.727 | 1.541 | 1.351 | 1.160 | 0.970 | 0.785 | 0.609 | 0.441 |
| | 2.1 | 2.402 | 2.243 | 2.073 | 1.895 | 1.710 | 1.518 | 1.324 | 1.129 | 0.935 | 0.747 | 0.567 |
| | 2.2 | 2.552 | 2.396 | 2.229 | 2.055 | 1.872 | 1.681 | 1.486 | 1.288 | 1.089 | 0.892 | 0.702 |
| | 2.3 | 2.691 | 2.538 | 2.376 | 2.204 | 2.025 | 1.837 | 1.643 | 1.444 | 1.243 | 1.040 | 0.842 |
| | 2.4 | 2.822 | 2.671 | 2.512 | 2.344 | 2.168 | 1.985 | 1.793 | 1.595 | 1.394 | 1.189 | 0.985 |
| | 2.5 | 2.945 | 2.795 | 2.639 | 2.475 | 2.302 | 2.122 | 1.935 | 1.740 | 1.541 | 1.337 | 1.130 |
| | 2.6 | 3.060 | 2.912 | 2.757 | 2.596 | 2.427 | 2.251 | 2.068 | 1.878 | 1.681 | 1.479 | 1.273 |
| | 2.7 | 3.169 | 3.022 | 2.868 | 2.709 | 2.544 | 2.371 | 2.192 | 2.006 | 1.813 | 1.615 | 1.411 |
| | 2.8 | 3.271 | 3.126 | 2.973 | 2.814 | 2.652 | 2.482 | 2.306 | 2.125 | 1.937 | 1.743 | 1.543 |
| | 2.9 | 3.367 | 3.222 | 3.071 | 2.913 | 2.752 | 2.585 | 2.413 | 2.235 | 2.052 | 1.862 | 1.667 |
| | 3.0 | 3.457 | 3.313 | 3.163 | 3.006 | 2.845 | 2.681 | 2.511 | 2.337 | 2.158 | 1.973 | 1.783 |
| | 3.1 | 3.540 | 3.396 | 3.247 | 3.093 | 2.932 | 2.769 | 2.602 | 2.431 | 2.255 | 2.075 | 1.890 |
| | 3.2 | 3.614 | 3.472 | 3.324 | 3.171 | 3.013 | 2.850 | 2.685 | 2.516 | 2.344 | 2.169 | 1.988 |
| | 3.3 | 3.677 | 3.540 | 3.393 | 3.242 | 3.086 | 2.924 | 2.760 | 2.594 | 2.424 | 2.252 | 2.076 |
| | 3.4 | 3.728 | 3.596 | 3.453 | 3.303 | 3.149 | 2.990 | 2.827 | 2.663 | 2.496 | 2.326 | 2.154 |
| | 3.5 | 3.768 | 3.638 | 3.502 | 3.355 | 3.204 | 3.048 | 2.886 | 2.724 | 2.559 | 2.392 | 2.223 |
| | 3.6 | 3.795 | 3.661 | 3.540 | 3.398 | 3.249 | 3.096 | 2.937 | 2.776 | 2.614 | 2.449 | 2.283 |
| | 3.7 | 3.807 | 3.672 | 3.564 | 3.428 | 3.283 | 3.133 | 2.979 | 2.819 | 2.659 | 2.498 | 2.334 |
| | 3.8 | 3.803 | 3.663 | 3.574 | 3.444 | 3.305 | 3.159 | 3.008 | 2.853 | 2.694 | 2.536 | 2.375 |
| | 3.9 | 3.784 | 3.638 | 3.569 | 3.446 | 3.314 | 3.172 | 3.026 | 2.876 | 2.720 | 2.564 | 2.407 |
| | 4.0 | 3.747 | 3.594 | 3.549 | 3.433 | 3.308 | 3.173 | 3.031 | 2.886 | 2.735 | 2.581 | 2.427 |

FIG. 11B

| Edge Intensity | RIM Transmission 50% | | RIM Size(um) | | | | | | | | | |
|---|---|---|---|---|---|---|---|---|---|---|---|---|
| | Line Width | BIM | 0.1 | 0.2 | 0.3 | 0.4 | 0.5 | 0.6 | 0.7 | 0.8 | 0.9 | 1 |
| 6um Pitch | 2.0 | 0.327 | 0.357 | 0.389 | 0.423 | 0.460 | 0.499 | 0.541 | 0.586 | 0.635 | 0.687 | 0.743 |
| | 2.1 | 0.325 | 0.354 | 0.385 | 0.417 | 0.452 | 0.488 | 0.527 | 0.569 | 0.614 | 0.662 | 0.713 |
| | 2.2 | 0.325 | 0.353 | 0.382 | 0.413 | 0.446 | 0.480 | 0.517 | 0.556 | 0.597 | 0.641 | 0.688 |
| | 2.3 | 0.324 | 0.352 | 0.380 | 0.410 | 0.442 | 0.474 | 0.508 | 0.545 | 0.583 | 0.623 | 0.667 |
| | 2.4 | 0.324 | 0.351 | 0.380 | 0.409 | 0.439 | 0.470 | 0.502 | 0.536 | 0.571 | 0.609 | 0.649 |
| | 2.5 | 0.325 | 0.352 | 0.379 | 0.408 | 0.437 | 0.467 | 0.497 | 0.529 | 0.562 | 0.597 | 0.634 |
| | 2.6 | 0.325 | 0.352 | 0.379 | 0.407 | 0.436 | 0.464 | 0.494 | 0.524 | 0.555 | 0.588 | 0.622 |
| | 2.7 | 0.326 | 0.352 | 0.380 | 0.407 | 0.436 | 0.463 | 0.492 | 0.521 | 0.550 | 0.581 | 0.612 |
| | 2.8 | 0.326 | 0.353 | 0.380 | 0.408 | 0.435 | 0.463 | 0.490 | 0.518 | 0.546 | 0.575 | 0.604 |
| | 2.9 | 0.327 | 0.353 | 0.381 | 0.408 | 0.435 | 0.462 | 0.490 | 0.517 | 0.544 | 0.571 | 0.599 |
| | 3.0 | 0.327 | 0.354 | 0.381 | 0.408 | 0.436 | 0.463 | 0.489 | 0.516 | 0.542 | 0.568 | 0.594 |
| | 3.1 | 0.326 | 0.353 | 0.381 | 0.408 | 0.436 | 0.463 | 0.489 | 0.515 | 0.541 | 0.566 | 0.591 |
| | 3.2 | 0.326 | 0.354 | 0.381 | 0.409 | 0.436 | 0.463 | 0.489 | 0.515 | 0.540 | 0.565 | 0.588 |
| | 3.3 | 0.324 | 0.352 | 0.380 | 0.408 | 0.435 | 0.463 | 0.489 | 0.515 | 0.540 | 0.563 | 0.587 |
| | 3.4 | 0.322 | 0.351 | 0.379 | 0.408 | 0.435 | 0.462 | 0.489 | 0.515 | 0.539 | 0.563 | 0.585 |
| | 3.5 | 0.319 | | 0.377 | 0.406 | 0.434 | 0.462 | 0.488 | 0.514 | 0.539 | 0.562 | 0.584 |
| | 3.6 | 0.315 | | 0.375 | 0.404 | 0.433 | 0.460 | 0.487 | 0.513 | 0.538 | 0.561 | 0.583 |
| | 3.7 | 0.310 | | 0.371 | 0.401 | 0.430 | 0.458 | 0.486 | 0.512 | 0.537 | 0.560 | 0.582 |
| | 3.8 | 0.304 | | 0.367 | 0.397 | 0.427 | 0.456 | 0.483 | 0.510 | 0.535 | 0.558 | 0.580 |
| | 3.9 | 0.297 | | 0.361 | 0.392 | 0.422 | 0.452 | 0.480 | 0.507 | 0.532 | 0.556 | 0.578 |
| | 4.0 | 0.288 | | 0.353 | 0.385 | 0.417 | 0.447 | 0.475 | 0.503 | 0.529 | 0.553 | 0.575 |

OPTICAL MASK FOR FORMING PATTERN

CROSS-REFERENCE TO RELATED APPLICATION

This application is a continuation of U.S. patent application Ser. No. 13/779,482 filed on Feb. 27, 2013, which claims priority to, and the benefit of, Korean Patent Application No. 10-2012-0124013 filed in the Korean Intellectual Property Office on Nov. 5, 2012, the entire contents of which are incorporated herein by reference.

BACKGROUND (a) Technical Field

The present disclosure relates to an optical mask for forming a pattern, and more particularly, to an optical mask including a halftone layer.

(b) Description of the Related Art

The ability to form fine patterns in the manufacture of electronic devices (such as display devices) is of interest to the electronics industry. For example, forming fine patterns in a display device allows the linewidth of wiring, electrodes, or other interconnects in the display device to be reduced. This can then result in form factor reduction and/or increased resolution of the display device.

In general, a photolithography process is used to form a pattern of wiring, electrodes, or other interconnects in an electronic device. The photolithography process generally includes forming a first layer (that is to be etched or patterned, e.g., a wiring/electrode layer) on a substrate, forming a photoresist layer (e.g., a photosensitive layer) on the first layer, positioning a mask (e.g., an optical mask) above the photoresist layer, and exposing the photoresist layer through the mask using a light source (in a light exposure system). The mask typically includes a light transmitting portion (that allows light to be transmitted through the mask) and a light blocking portion (that prevents light from transmitting through the mask). A mask consisting of a light blocking portion and a light transmitting portion is called a binary mask.

After the photoresist layer has been exposed using the light source, a photosensitive pattern is formed by developing the exposed photoresist layer. Next, the first layer is etched using the photosensitive pattern as an etching mask, so as to form a desired pattern of electrodes, wiring, or other interconnects.

As previously stated, it is desirable to reduce the linewidth of a pattern of wiring, electrodes, or interconnects in a display device, so as to reduce the form factor and/or increase the resolution of the display device. However, reductions in linewidth of the pattern may be limited by the resolution of the light exposure system. For example, the smallest feature size or linewidth that can be formed (or resolved) typically depends on a wavelength of the light source. To overcome the inherent resolution limitations in existing light exposure systems, various improvements have been proposed (e.g., relating to new exposure systems, lithography processes, or optical imaging materials).

Although the resolution of a light exposure system may be improved using one or more of the above proposed means, other challenges may arise. For example, in forming a fine pitch wiring pattern, a fine-patterned mask (e.g., a fine-patterned binary mask) is usually required. However, the decreased linewidth/spacing on the fine-patterned mask may result in a reduction in exposure sensitivity. This is because less light can pass through the light transmitting portion of the fine-patterned mask, compared to a mask with a larger linewidth/spacing pattern. As a result of the reduced exposure sensitivity, portions of the photoresist layer on the substrate may not be fully exposed and developed during the photolithography process. This may subsequently impact the quality of the photosensitive pattern and formation of the fine wiring pattern.

SUMMARY

The present disclosure is directed to address at least the above problems in the prior art.

According to some embodiments of the inventive concept, an optical mask for forming a pattern is provided. The optical mask includes: a substrate including a light blocking pattern formed on portions of the substrate, wherein the light blocking pattern includes a halftone layer and a light blocking layer formed on the halftone layer, and the halftone layer and the light blocking layer overlap such that at least an edge portion of the halftone layer is exposed.

In some embodiments, a pitch of the light blocking pattern may be about 6 µm, and a transmission ratio of the halftone layer may range from about 10% to about 50%.

In some embodiments, a width of the edge portion of the halftone layer may range from about 0.1 µm to about 1 µm.

In some embodiments, a linewidth of the light blocking pattern may range from about 2.4 µm to about 4.0 µm.

In some embodiments, when the transmission ratio of the halftone layer is about 10%: the width of the edge portion of the halftone layer may be about 0.1 µm if the linewidth of the light blocking pattern is about 2.4 µm; the width of the edge portion of the halftone layer may range from about 0.1 µm to about 0.2 µm if the linewidth of the light blocking pattern is about 2.5 µm; the width of the edge portion of the halftone layer may range from about 0.1 µm to about 0.4 µm if the linewidth of the light blocking pattern is about 2.6 µm; the width of the edge portion of the halftone layer may range from about 0.1 µm to about 0.5 µm if the linewidth of the light blocking pattern is about 2.7 µm; the width of the edge portion of the halftone layer may range from about 0.1 µm to about 0.6 µm if the linewidth of the light blocking pattern is about 2.8 µm; the width of the edge portion of the halftone layer may range from about 0.1 µm to about 0.7 µm if the linewidth of the light blocking pattern is about 2.9 µm; and the width of the edge portion of the halftone layer may range from about 0.1 µm to about 0.9 µm if the linewidth of the light blocking pattern is about 3.0 µm.

In some embodiments, when the transmission ratio of the halftone layer is about 20%: the width of the edge portion of the halftone layer may be about 0.1 µm if the linewidth of the light blocking pattern is about 2.5 µm; the width of the edge portion of the halftone layer may range from about 0.1 µm to about 0.3 µm if the linewidth of the light blocking pattern is about 2.6 µm; the width of the edge portion of the halftone layer may range from about 0.1 µm to about 0.4 µm if the linewidth of the light blocking pattern is about 2.7 µm; the width of the edge portion of the halftone layer may range from about 0.1 µm to about 0.5 µm if the linewidth of the light blocking pattern ranges from about 2.8 µm to about 2.9 µm; the width of the edge portion of the halftone layer may range from about 0.1 µm to about 0.6 µm if the linewidth of the light blocking pattern is about 3.0 µm; the width of the edge portion of the halftone layer may range from about 0.1 µm to about 0.7 µm if the linewidth of the light blocking pattern is about 3.1 µm; the width of the edge portion of the halftone layer may range from about 0.1 µm to about 0.8 µm if the linewidth of the light blocking pattern ranges from about 3.2 µm to about 3.3 µm; and the width of the edge portion of the halftone layer may range from about 0.1 µm to about 0.9 µm if the linewidth of the light blocking pattern ranges from about 3.4 µm to about 3.5 µm.

In some embodiments, when the transmission ratio of the halftone layer is about 30%: the width of the edge portion of the halftone layer may be about 0.1 µm if the linewidth of the light blocking pattern is about 2.5 µm; the width of the edge portion of the halftone layer may range from about 0.1 µm to about 0.2 µm if the linewidth of the light blocking pattern is about 2.6 µm; the width of the edge portion of the halftone layer may range from about 0.1 µm to about 0.3 µm if the linewidth of the light blocking pattern is about 2.7 µm; the width of the edge portion of the halftone layer may range from about 0.1 µm to about 0.4 µm if the linewidth of the light blocking pattern ranges from about 2.8 µm to about 2.9 µm; the width of the edge portion of the halftone layer may range from about 0.1 µm to about 0.5 µm if the linewidth of the light blocking pattern is about 3.0 µm; the width of the edge portion of the halftone layer may range from about 0.1 µm to about 0.6 µm if the linewidth of the light blocking pattern ranges from about 3.1 µm to about 3.2 µm; the width of the edge portion of the halftone layer may range from about 0.1 µm to about 0.7 µm if the linewidth of the light blocking pattern ranges from about 3.3 µm to about 3.4 µm; the width of the edge portion of the halftone layer may range from about 0.1 µm to about 0.8 µm if the linewidth of the light blocking pattern ranges from about 3.5 µm to about 3.6 µm; and the width of the edge portion of the halftone layer may range from about 0.1 µm to about 0.9 µm if the linewidth of the light blocking pattern ranges from about 3.7 µm to about 4.0 µm.

In some embodiments, when the transmission ratio of the halftone layer is about 40%: the width of the edge portion of the halftone layer may be about 0.1 µm if the linewidth of the light blocking pattern is about 2.5 µm; the width of the edge portion of the halftone layer may range from about 0.1 µm to about 0.2 µm if the linewidth of the light blocking pattern is about 2.6 µm; the width of the edge portion of the halftone layer may range from about 0.1 µm to about 0.3 µm if the linewidth of the light blocking pattern ranges from about 2.7 µm to about 2.8 µm; the width of the edge portion of the halftone layer may range from about 0.1 µm to about 0.4 µm if the linewidth of the light blocking pattern is about 2.9 µm; the width of the edge portion of the halftone layer may range from about 0.1 µm to about 0.5 µm if the linewidth of the light blocking pattern ranges from about 3.0 µm to about 3.1 µm; the width of the edge portion of the halftone layer may range from about 0.1 µm to about 0.6 µm if the linewidth of the light blocking pattern ranges from about 3.2 µm to about 3.3 µm; the width of the edge portion of the halftone layer may range from about 0.1 µm to about 0.7 µm if the linewidth of the light blocking pattern ranges from about 3.4 µm to about 3.6 µm; and the width of the edge portion of the halftone layer may range from about 0.1 µm to about 0.8 µm if the linewidth of the light blocking pattern ranges from about 3.7 µm to about 4.0 µm.

In some embodiments, when the transmission ratio of the halftone layer is about 50%: the width of the edge portion of the halftone layer may be about 0.1 µm if the linewidth of the light blocking pattern is about 2.5 µm; the width of the edge portion of the halftone layer may range from about 0.1 µm to about 0.2 µm if the linewidth of the light blocking pattern ranges from about 2.6 µm to about 2.7 µm; the width of the edge portion of the halftone layer may range from about 0.1 µm to about 0.3 µm if the linewidth of the light blocking pattern ranges from about 2.8 µm to about 2.9 µm; the width of the edge portion of the halftone layer may range from about 0.1 µm to about 0.4 µm if the linewidth of the light blocking pattern is about 3.0 µm; the width of the edge portion of the halftone layer may range from about 0.1 µm to about 0.5 µm if the linewidth of the light blocking pattern ranges from about 3.1 µm to about 3.2 µm; the width of the edge portion of the halftone layer may range from about 0.1 µm to about 0.6 µm if the linewidth of the light blocking pattern ranges from about 3.3 µm to about 3.5 µm; and the width of the edge portion of the halftone layer may range from about 0.1 µm to about 0.7 µm if the linewidth of the light blocking pattern ranges from about 3.6 µm to about 4.0 µm.

BRIEF DESCRIPTION OF THE DRAWINGS

In the interest of clarity, the following abbreviated terms will be used in the Brief Description of the Drawings section. With reference to the different embodiments of the inventive concept, a pitch of a light blocking pattern of an optical mask is referred to as "pitch"; a linewidth of the light blocking pattern of the optical mask is referred to as "linewidth"; a width of a RIM edge portion of a halftone layer of the optical mask is referred to as "RIM size"; and a transmission ratio of the halftone layer of the optical mask is referred to as "transmission ratio". The above terms will be more fully described in the Detailed Description section.

FIGS. 7A, 8A, 9A, 10A, and 11A are tables listing the NILS values for different transmission ratios, linewidths, and RIM sizes according to different embodiments of the inventive concept.

FIGS. 7B, 8B, 9B, 10B, and 11B are tables listing the edge intensity values for different transmission ratios, linewidths, and RIM sizes according to different embodiments of the inventive concept.

DETAILED DESCRIPTION

Figure 1:
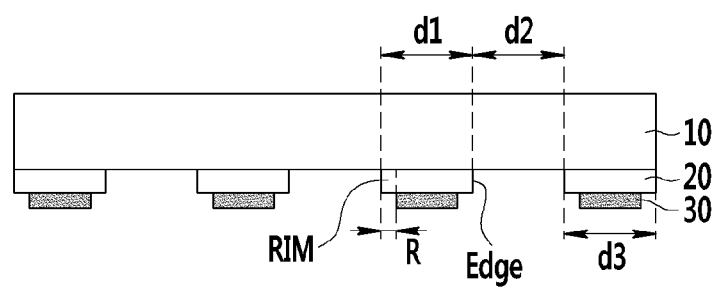
FIG. 1 is a cross-sectional view of an optical mask according to an embodiment of the inventive concept.

The inventive concept will be more fully described herein with reference to the accompanying drawings, in which different embodiments are shown. As those skilled in the art would recognize, the described embodiments may be modified in various ways without departing from the spirit or scope of the inventive concept.

In the drawings, the thickness of layers, films, panels, regions, etc., have been exaggerated for clarity. Like reference numerals designate like elements throughout the specification. It is noted that when an element such as a layer, film, region, or substrate is referred to as being formed "on" another element, it can either be formed directly on the other element, or formed on one or more intervening elements located between the two elements. In contrast, when an element is referred to as being formed "directly on" another element, there is no intervening element present between the two elements.

Figure 2:
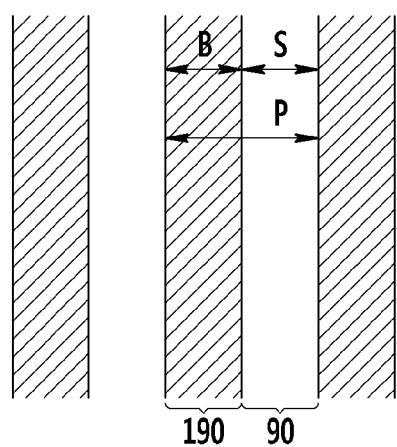
FIG. 2 is a top plan view of a pattern formed via a photolithography process using the optical mask of FIG. 1.

First, referring to FIGS. 1 and 2, an optical mask and a pattern formed using the optical mask according to an embodiment of the inventive concept will be described. FIG. 1 is a cross-sectional view of the optical mask, and FIG. 2 is a top plan view of the pattern formed via a photolithography process using the optical mask.

Referring to FIG. 1, the optical mask includes a light blocking pattern formed on a substrate 10. The substrate 10 may be formed of a transparent insulating material (such as quartz). The light blocking pattern includes a halftone layer 20 formed on portions of the substrate 10, and a light blocking layer 30 formed on the halftone layer 20, with the halftone layer 20 located between the light blocking layer 30 and the portions of the substrate 10.

Referring to FIG. 1, other portions of the substrate 10 (on which the light blocking pattern is not formed) allow light to be fully transmitted. These light transmitting portions on the substrate 10 are characterized as each having a width d2.

As for the light blocking pattern, the halftone layer 20 and the light blocking layer 30 may each have different light transmission characteristics. For example, the light blocking layer 30 may completely block transmission of light at areas where the light blocking layer 30 is located. The halftone layer 20 may allow portions of light passing through the substrate 10 to be transmitted (through the halftone layer 20), and prevent other portions of light from being transmitted (e.g., at the regions where the light blocking layer 30 is formed on the halftone layer 20). A transmission ratio of the halftone layer 20 (hereinafter referred to as "transmission ratio") may be determined by the amount (percentage) of light transmitted through the halftone layer 20. In some embodiments, the transmission ratio of the halftone layer 20 may range from about 10% to about 90%.

In some embodiments, the halftone layer 20 may be formed of a material including at least one of the elements Mo, Si, Ta, W, Al, Cr, Hf, Zr, Me, V, Ni, Nb, Co, or Ti. In some other embodiments, the halftone layer 20 may be formed of a material including at least one of COx, Ox, or Nx (where x is a natural number), in addition to at least one of the elements Mo, Si, Ta, W, Al, Cr, Hf, Zr, Me, V, Ni, Nb, Co, or Ti.

In some embodiments, the light blocking layer 30 may be formed of a material that completely blocks the transmission of light. For example, the material for the light blocking layer 30 may include a metal (such as chromium (Cr)) or other similar opaque materials.

The halftone layer 20 and the light blocking layer 30 may overlap. For example, with reference to FIG. 1, a linewidth d1 of the halftone layer 20 (hereinafter referred to as "linewidth d1") may be greater than a linewidth d3 of the light blocking layer 30 (hereinafter referred to as "linewidth d3"). As a result, an edge of the light blocking layer 30 may be positioned within a RIM edge portion of the halftone layer 20, such that the RIM edge portion of the halftone layer 20 is not covered by the light blocking layer 30. A width R of the RIM edge portion of the halftone layer 20 (hereinafter referred to as "RIM size"), as measured from an edge of the halftone layer 20 to a (nearest) edge of the light blocking layer 30, is given by $R = d1 - d3$. In the above embodiment, the width R is greater than zero since the linewidth d1 is greater than linewidth d3.

A linewidth of the light blocking pattern of the optical mask may be defined by a largest linewidth of the light blocking pattern. In the optical mask embodiment of FIG. 1, since the largest linewidth of the light blocking pattern corresponds to the linewidth d1 (of the halftone layer 20), the linewidth of the light blocking pattern is the same as the linewidth d1.

A pitch of the light blocking pattern of the optical mask (hereinafter referred to as "pitch") is given by the distance between adjacent lines (e.g., the distance between adjacent halftone layers 20) in the light blocking pattern. Referring to FIG. 1, the pitch is given by d1+d2.

Next, the differences between the optical mask embodiment of FIG. 1 and a binary mask of the prior art will be described. In a binary mask, the light blocking pattern may only include a light blocking layer (similar in function to light blocking layer 30) that completely blocks transmission of light through the binary mask. Unlike the binary mask, the optical mask embodiment of FIG. 1 further includes a halftone layer 20 located between a light blocking layer 30 and a substrate 10. As described later in the specification, the halftone layer 20 can increase exposure sensitivity and edge intensity, thereby allowing for fine patterns on the optical mask embodiment of FIG. 1. Subsequently, patterns of wiring, electrodes, or interconnects with reduced linewidths (compared to those that can be achieved using a binary mask) can be formed using the optical mask embodiment of FIG. 1.

FIG. 2 is a top plan view of a pattern formed via a photolithography process according to an embodiment of the inventive concept. Referring to FIG. 2, a pixel electrode pattern of a liquid crystal display may be formed via an exposure and etching method using the optical mask of FIG. 1. In some embodiments, the pixel electrode pattern may include a fine pattern. The fine pattern may enable greater control over the arrangement of liquid crystal molecules in the liquid crystal display.

As shown in FIG. 2, the pixel electrode pattern may include an electrode portion 190 and a slit 90. The electrode 190 has a linewidth B and the slit 90 has a spacing width S. A pitch P of the pixel electrode pattern is given by $P = B + S$. When a pattern having a periodically repeating shape at a predetermined pitch (e.g., the pixel electrode pattern of FIG. 2) is formed using an optical mask (e.g., the optical mask of FIG. 1), the light blocking pattern of the optical mask may also include a same (or similar) periodically repeating shape at a same (or similar) predetermined pitch.

The light blocking pattern and light transmitting portion of the optical mask of FIG. 1 may have dimensions similar to those of the electrode portion 190 and slit 90, respectively, of FIG. 2. For example, when the pitch P of the pixel electrode pattern of FIG. 2 is about 6 μm, the linewidth B of the electrode portion 190 may range from about 3.0 μm to about 3.4 μm, and the spacing width S of the slit 90 may range from about 2.6 μm to about 3 μm. In the above embodiments, the pitch of the light blocking pattern of the optical mask (i.e., d1+d2, see FIG. 1) is about 6 μm, the linewidth of the light blocking pattern (i.e., linewidth d1) may range from about 3.2 μm to about 3.7 μm, and the width d2 of the light transmitting portion may range from about 2.3 μm to about 2.8 μm.

As noted previously, when the linewidth of the light blocking pattern in a binary mask is increased, the intensity of light reaching the photoresist layer decreases. This is because less light can pass through the reduced area of the light transmitting portion. As a result of the lower light intensity, the exposure sensitivity and edge intensity may deteriorate, and portions of the photoresist layer on the substrate may not be fully exposed and developed during photolithography. This may impact the quality of the photosensitive pattern and the subsequently formed pixel electrode pattern.

In contrast to the binary mask, the optical mask embodiment of FIG. 1 allows the linewidth of the light blocking pattern (e.g., d1 and/or d2) to be increased without a corresponding decrease (or deterioration) in exposure sensitivity. This is because light passing through the RIM edge portion of the halftone layer 20 of the light blocking pattern is diffracted, such that some of the diffracted light may be incident on regions corresponding to the light transmitting portion of the optical mask. The diffracted light increases the intensity of light transmitted through the light transmitting portion of the optical mask, thereby improving exposure sensitivity.

In addition to improving exposure sensitivity, the diffracted light from the RIM edge portion of the halftone layer 20 also improves edge intensity. The edge intensity is the intensity of light transmitted toward regions corresponding to the edges of the light blocking pattern of the optical mask.

As a result of the improved exposure sensitivity and edge intensity, the optical mask embodiment of FIG. 1 allows the linewidth/spacing of a pixel electrode pattern to be further reduced (compared to a binary mask) without impact to the quality of the photosensitive pattern and the subsequently formed pixel electrode pattern.

In some instances, although exposure sensitivity is improved, an NILS (Normalized Image Log Slope) value relating to exposure quality may vary, depending on parameters such as conditions of the halftone layer 20 and linewidth of the light blocking pattern. The NILS is a metric of image quality and represents the (normalized) intensity gradient at multiple positions of a line edge. The NILS value may be calculated as follows:

$$NILS = w\left(\frac{d(\ln I)}{dx}\right) = \frac{w}{I}\left(\frac{dI}{dx}\right) \quad (1)$$

where w is the linewidth (e.g., linewidth B) of the electrode portion (e.g., electrode portion 190) of the pattern (e.g., pixel electrode pattern) to be formed, I is the intensity of light (or a threshold value of the light), ln is the natural algorithm function, x is a position along an edge of the light blocking pattern, and dI/dx is a slope of the intensity of transmitted light at the position along the edge of the light blocking pattern. An optimal value of the slope of the intensity of light (dI/dx) can be obtained when a change in the width of the electrode portion of the pattern (according to change in intensity I of light) is small. When dI/dx increases, the deviation in the lithography process (hereinafter referred to as "process deviation") may decrease, resulting in higher process margins in the manufacture of a pixel electrode pattern. Generally, an increase in NILS value corresponds to an increase in contrast ratio of the intensity of light (I) irradiated through the optical mask.

However, as shown in Equation 1 above, the NILS value may decrease when the intensity of light (I) passing through the optical mask increases (with the linewidth w remaining constant). In some instances, the decrease in NILS value may reduce exposure quality and increase process deviation.

Next, conditions for obtaining good exposure quality, low process deviation, and improved exposure sensitivity (relative to a binary mask) using an optical mask embodiment of the inventive concept will be described with reference to FIGS. 3 and 4.

Figure 3:
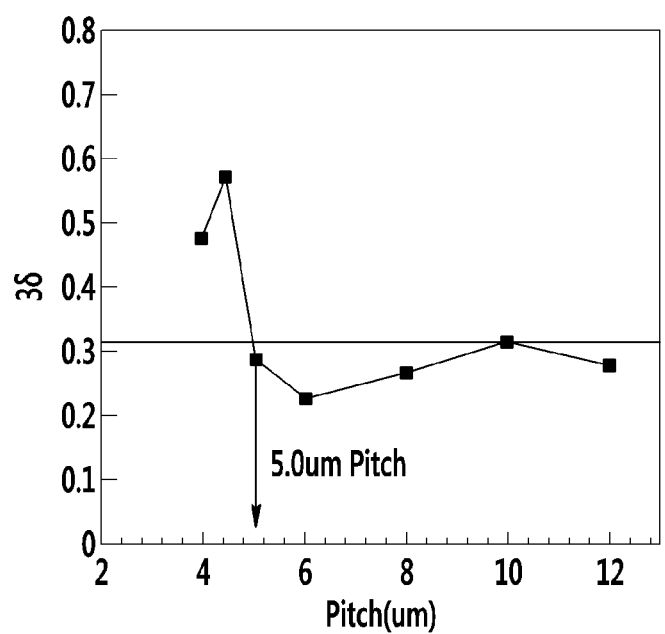
FIG. 3 is a graph illustrating the change in process deviation, plotted as a function of pitch according to an embodiment of the inventive concept.

FIG. 3 is a graph illustrating the change in process deviation, plotted as a function of pitch of the light blocking pattern according to an embodiment of the inventive concept.

Referring to FIG. 3, when the pitch of the light blocking pattern of the optical mask is more than or equal to about 5 μm, the process deviation 3δ lies within a 3-sigma control limit, as indicated by the points lying on or below the horizontal line 3δ≅0.31 (the 3-sigma control limit). In other words, there is no significant change in the process when the pitch of the light blocking pattern is more than or equal to about 5 μm. But when the pitch of the light blocking pattern is less than about 5 μm, the process deviation 3δ increases sharply and falls outside the 3-sigma control limit, as indicated by the points lying above the horizontal line 3δ≅0.31 (the 3-sigma control limit). Thus, in order to keep the process within the 3-sigma control limit, the pitch of the light blocking pattern of the optical mask should preferably be more than or equal to about 5 μm. For example, in some embodiments, the pitch of the light blocking pattern may be about 6 μm.

Figure 4:
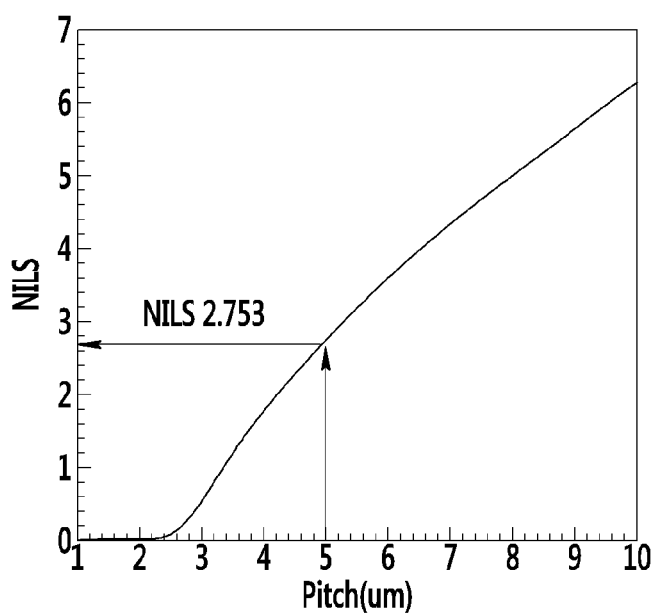
FIG. 4 is a graph illustrating the change in NILS value, plotted as a function of pitch according to an embodiment of the inventive concept.

FIG. 4 is a graph illustrating the change in NILS value, plotted as a function of the pitch of the light blocking pattern according to an embodiment of the inventive concept.

Referring to FIG. 4, when the pitch of the light blocking pattern is about 5 μm, the NILS value is about 2.753. As previously described with reference to FIG. 3, when the pitch of the light blocking pattern is less than about 5 μm, the process deviation 3δ increases sharply and falls outside the 3-sigma control limit. Therefore, the NILS value of about 2.753 may be considered to be a threshold value of the exposure quality. At or above this threshold value, a high quality pixel electrode pattern can be obtained as a result of low process deviation (since the process deviation 3δ lies within the 3-sigma control limit). Conversely, when the NILS value is less than about 2.753, the process control and quality of the pixel electrode pattern may deteriorate due to the sharp increase in process deviation (since the process deviation 3δ falls outside the 3-sigma control limit).

As shown in FIG. 4, the NILS value generally increases when the pitch of the light blocking pattern of the optical mask increases (starting at a pitch of about 2.4 μm). As previously mentioned, an increase in NILS value generally corresponds to an increase in contrast ratio of the intensity of light (I) irradiated through the optical mask. However, as shown in FIGS. 3 and 4, the improvement in process deviation 3δ may not be significant when the pitch is more than about 5 μm (i.e., when the NILS value is more than about 2.753). To obtain a pixel electrode pattern with minimum linewidth/spacing (while maintaining good exposure quality, low process deviation, and improved exposure sensitivity), the pitch of the light blocking pattern of the optical mask may preferably range from about 5 μm to about 6 μm. In some embodiments, the pitch of the light blocking pattern may be about 6 μm.

FIGS. 5A to 5E are graphs illustrating the change in NILS value for different transmission ratios and RIM sizes, plotted as a function of linewidth according to different embodiments of the inventive concept. Specifically, FIGS. 5A to 5E show simulation results of the change in NILS value for different transmission ratios and RIM sizes (R) of a RIM edge portion of a halftone layer (e.g., halftone layer 20), plotted against a linewidth of a light blocking pattern (e.g., the light blocking pattern of FIG. 1).

Referring to FIGS. 5A to 5E, the top curve (solid line in bold) in each graph represents the change in NILS value for a binary mask, and the curves (dotted lines, etc.) below the top curve represent the change in NILS value for different RIM sizes (ranging from R=0.1 μm to R=1.0 μm) according to different optical mask embodiments of the inventive concept. As shown in FIGS. 5A to 5E, the NILS value for the binary mask remain unchanged regardless of the transmission ratio (i.e., the NILS values for the binary mask are the same across the range of linewidth shown when the transmission ratio increases from 10% to 50%).

In contrast, the NILS value of the optical mask embodiments of the inventive concept changes with the transmission ratio and RIM sizes (R) of the halftone layer. For example, referring to FIGS. 5A to 5E, for each transmission ratio, as the RIM size increases (from R=0.1 µm to R=1.0 µm), the NILS value decreases, with the NILS value at R=1.0 µm having the largest decrease (relative to the NILS value for the binary mask). Comparing FIGS. 5A to 5E, it is further observed that the decrease in NILS value for each RIM size becomes greater as the transmission ratio increases (from 10% to 50%). Taking the NILS values for a RIM size of 0.5 µm as an example: the NILS values at 20% transmission ratio are lower than the corresponding NILS values at 10% transmission ratio; the NILS values at 30% transmission ratio are lower than the corresponding NILS values at 20% transmission ratio; the NILS values at 40% transmission ratio are lower than the corresponding NILS values at 30% transmission ratio; and the NILS values at 50% transmission ratio are lower than the corresponding NILS values at 40% transmission ratio.

Figure 5A:
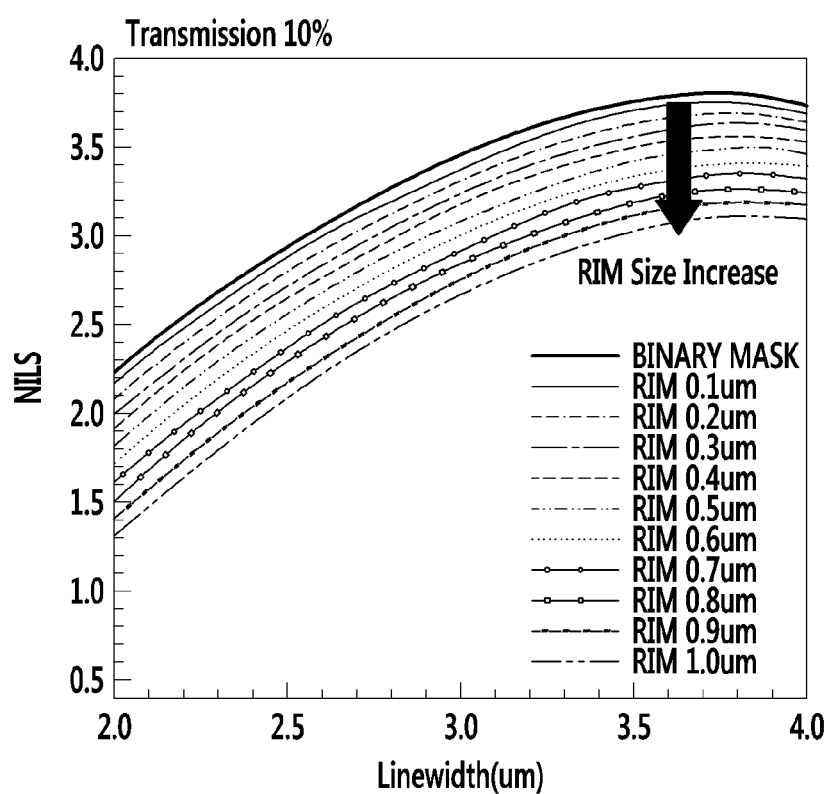
FIGS. 5A to 5E are graphs illustrating the change in NILS value for different transmission ratios and RIM sizes, plotted as a function of linewidth according to different embodiments of the inventive concept.
Figure 5B:
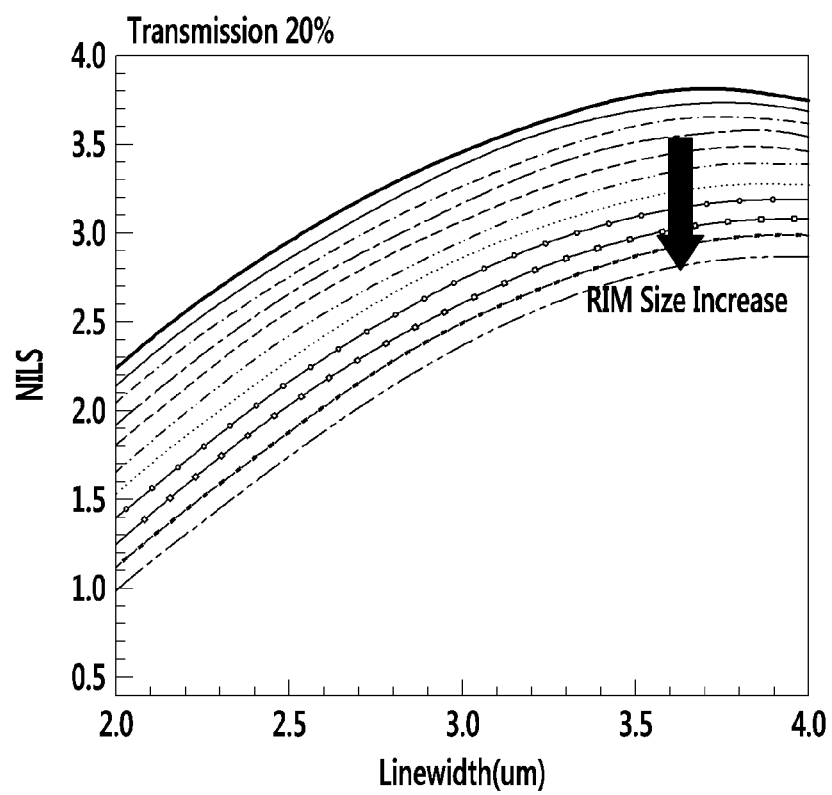
Figure 5C:
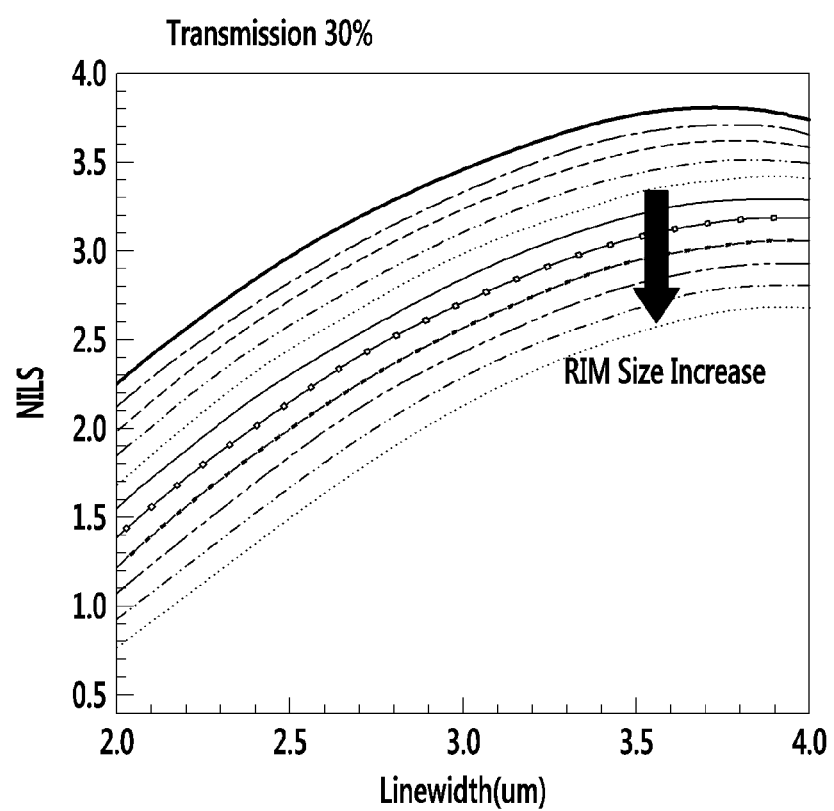
Figure 5D:
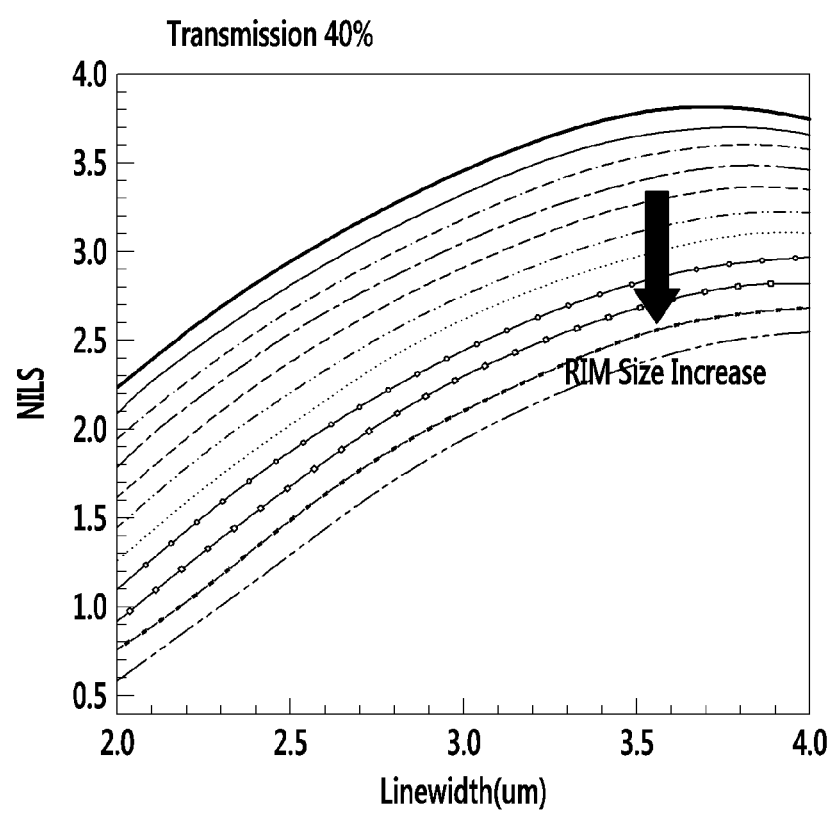
Figure 5E:
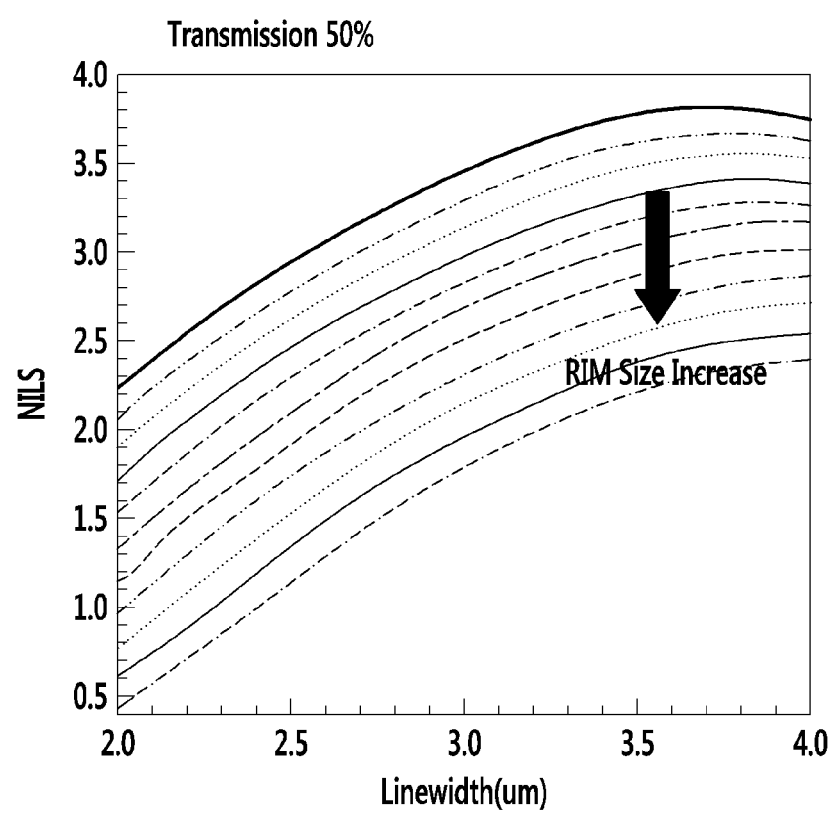
Figure 5F:
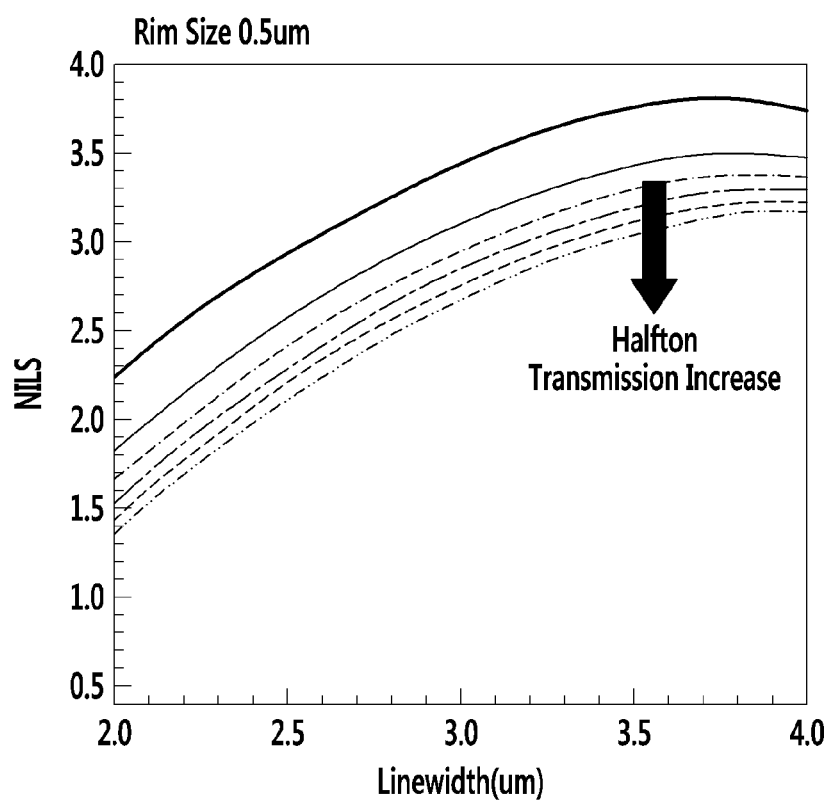
FIG. 5F is a graph illustrating the change in NILS value for different transmission ratios for an optical mask having a RIM size of 0.5 µm, plotted as a function of linewidth according to different embodiments of the inventive concept.
Figure 6A:
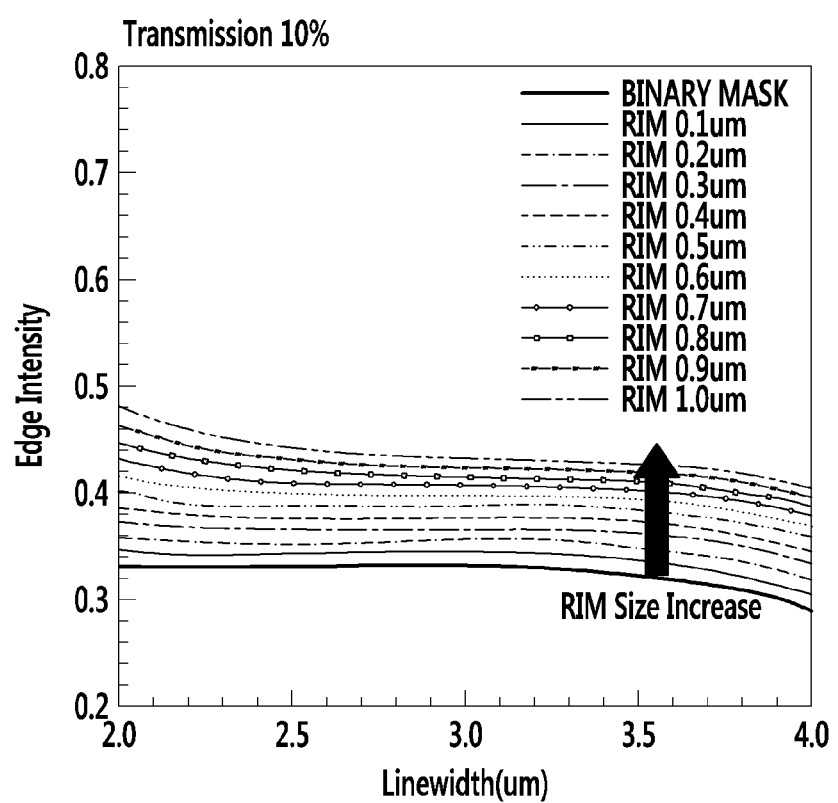
FIGS. 6A to 6E are graphs illustrating the change in edge intensity value for different transmission ratios and RIM sizes, plotted as a function of linewidth according to different embodiments of the inventive concept.
Figure 6B:
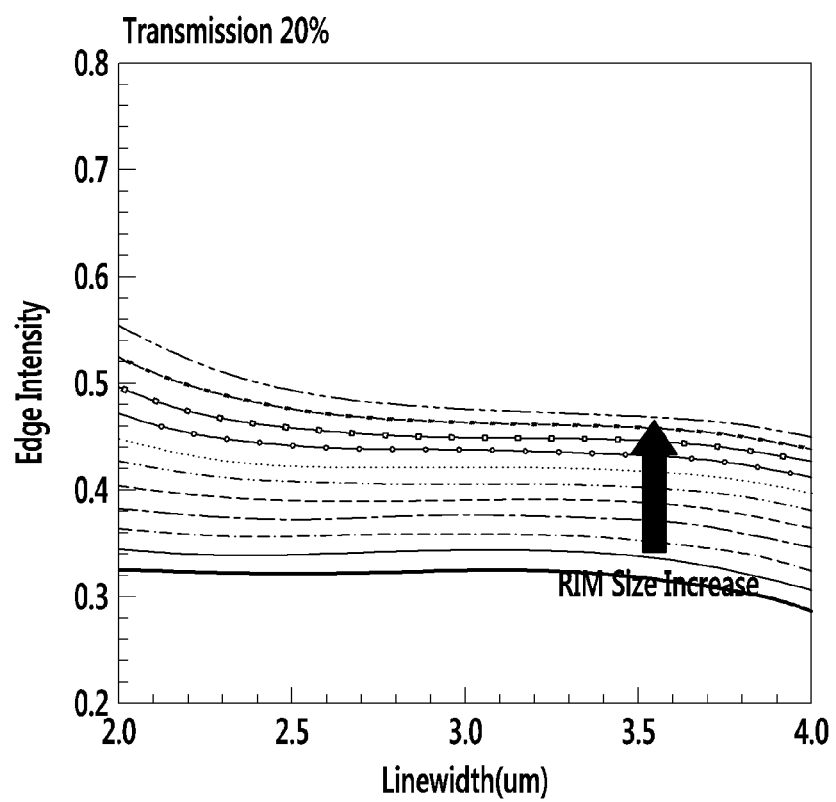
Figure 6C:
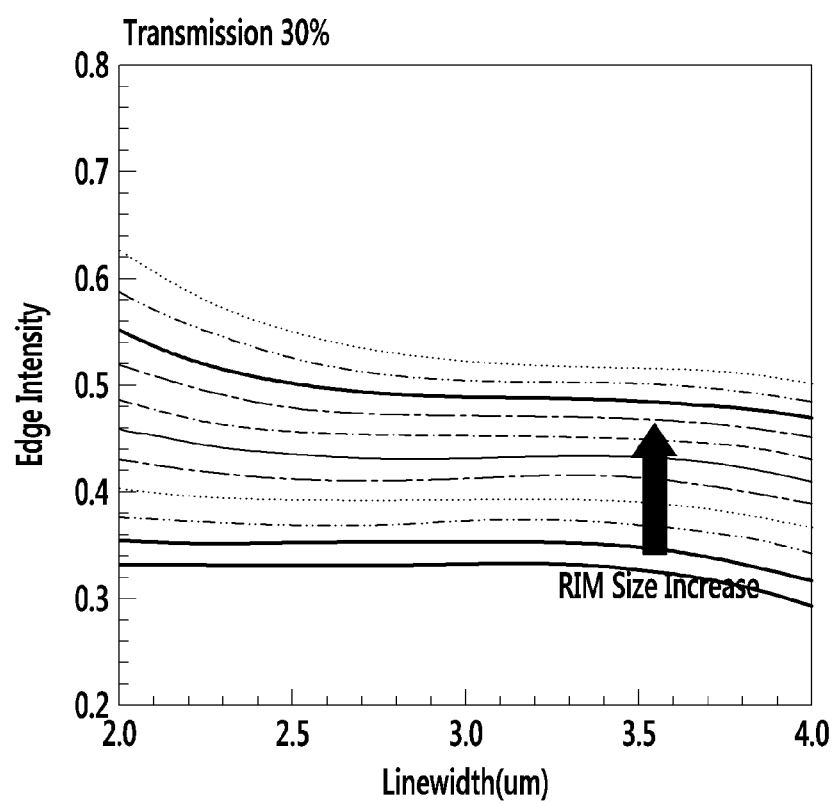
Figure 6D:
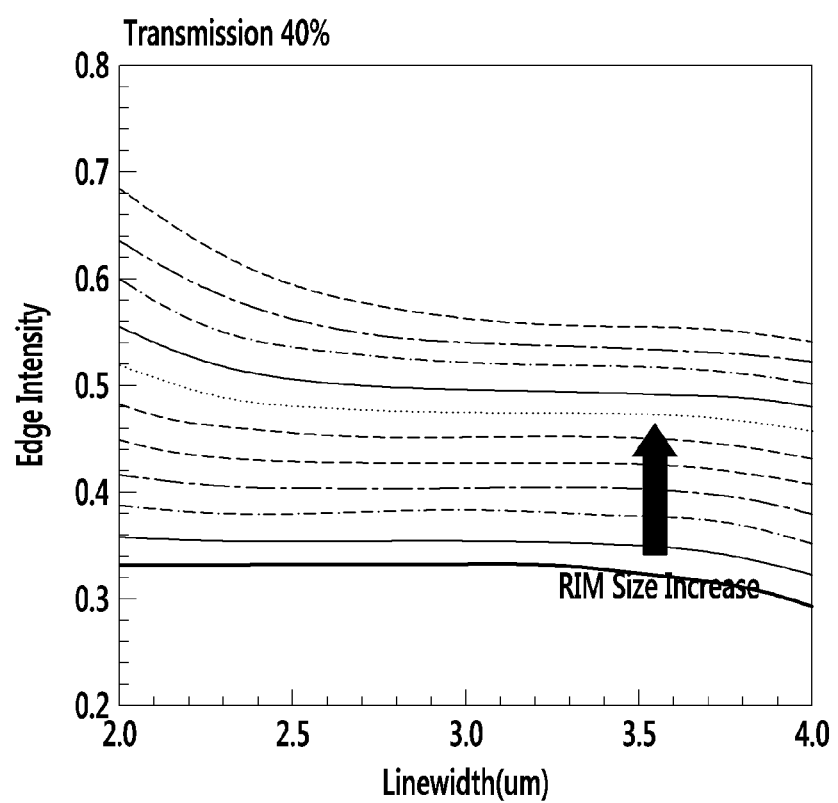
Figure 6E:
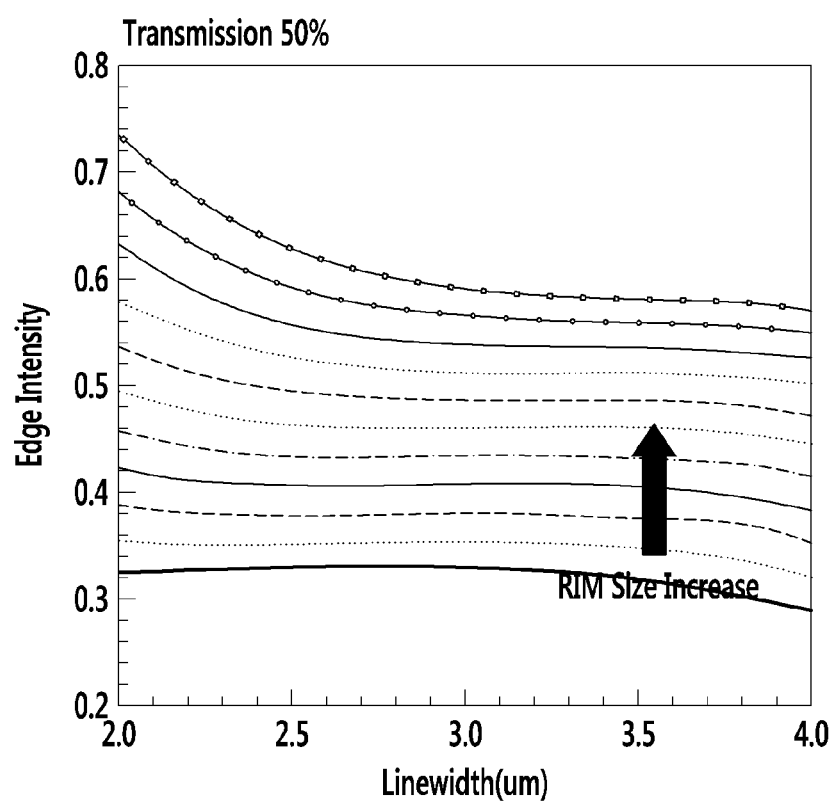

FIG. 5F provides another way of illustrating the simulation results in FIGS. 5A to 5E. Specifically, FIG. 5F is a graph illustrating the change in NILS value for different transmission ratios for an optical mask with a RIM size of 0.5 µm, plotted as a function of linewidth according to different embodiments of the inventive concept.

Referring to FIG. 5F, the top curve (solid line in bold) represents the change in NILS value for a binary mask, and the curves (dotted lines, etc.) below the top curve represent the change in NILS value for different transmission ratios (ranging from 10% to 50%) according to different optical mask embodiments. As shown in FIGS. 5A to 5F, the top curve (solid line in bold) in FIG. 5F is the same as the top curve (solid line in bold) in each of FIGS. 5A to 5E, with the top curves all representing the NILS value for the binary mask.

Referring to FIG. 5F, as the transmission ratio of the halftone layer increases, the NILS value decreases, with the NILS value at 50% transmission ratio having the largest decrease (relative to the NILS value for the binary mask). Thus, the change in NILS value shown in FIG. 5F is consistent with the change in NILS value shown in FIGS. 5A to 5E.

FIGS. 6A to 6E are graphs illustrating the change in edge intensity value for different transmission ratios and RIM sizes, plotted as a function of linewidth according to different embodiments of the inventive concept. Specifically, FIGS. 6A to 6E show simulation results of the change in edge intensity value for different transmission ratios and RIM sizes (R) of a RIM edge portion of a halftone layer (e.g., halftone layer 20), plotted against a linewidth of a light blocking pattern (e.g., the light blocking pattern of FIG. 1).

Referring to FIGS. 6A to 6E, the bottom curve (solid line in bold) in each graph represents the change in edge intensity value for a binary mask, and the curves (dotted lines, etc.) above the bottom curve represent the change in edge intensity value for different RIM sizes (ranging from R=0.1 µm to R=1.0 µm) according to different optical mask embodiments. As shown in FIGS. 6A to 6E, the edge intensity value for the binary mask remains unchanged regardless of the transmission ratio (i.e., the edge intensity values for the binary mask are the same across the range of linewidth shown when the transmission ratio increases from 10% to 50%).

In contrast, the edge intensity value of the optical mask embodiments of the inventive concept changes with the transmission ratio and RIM size (R) of the halftone layer 20. For example, referring to FIGS. 6A to 6E, for each transmission ratio, as the RIM size increases (from R=0.1 µm to R=1.0 µm), the edge intensity value also increases, with the edge intensity value at R=1.0 µm having the largest increase (relative to the edge intensity value for the binary mask). Comparing FIGS. 6A to 6E, it is further observed that the increase in edge intensity value for each RIM size becomes greater as the transmission ratio increases. Taking the edge intensity values for a RIM size of 0.5 µm as an example: the edge intensity values at 20% transmission ratio are greater than the corresponding edge intensity values at 10% transmission ratio; the edge intensity values at 30% transmission ratio are greater than the corresponding edge intensity values at 20% transmission ratio; the edge intensity values at 40% transmission ratio are greater than the corresponding edge intensity values at 30% transmission ratio; and the edge intensity values at 50% transmission ratio are greater than the corresponding edge intensity values at 40% transmission ratio.

Based on at least the simulation results provided in FIGS. 5A to 5F and 6A to 6E, conditions for improving exposure sensitivity and edge intensity (without deterioration in process deviation) may be obtained according to different embodiments of the inventive concept. These conditions are herein described with reference to FIGS. 7A to 11B.

In the examples of FIGS. 7A to 11B, the pitch of the light blocking pattern is about 6 µm.

FIGS. 7A, 8A, 9A, 10A, and 11A are tables listing the NILS values for different transmission ratios, linewidths of the light blocking pattern, and RIM sizes of the RIM edge portion of the halftone layer according to different embodiments of the inventive concept.

FIGS. 7B, 8B, 9B, 10B, and 11B are tables listing the edge intensity values for different transmission ratios, linewidths of the light blocking pattern, and RIM sizes of the RIM edge portion of the halftone layer according to the respective embodiments in FIGS. 7A, 8A, 9A, 10A, and 11A.

FIG. 7A is a table listing the NILS values for different linewidths of a light blocking pattern and RIM sizes (R) of a halftone layer (e.g., halftone layer 20), wherein the halftone layer has a transmission ratio of about 10% and the light blocking pattern has a pitch of about 6 µm.

As previously described with reference to FIG. 4, the NILS value of about 2.753 may be considered to be a threshold value of the exposure quality. At or above this threshold value, a high quality pixel electrode pattern may be obtained due to the low process deviation (since the process deviation 3δ is within the 3-sigma control limit). Conversely, when the NILS value is below this threshold value, the process control and quality of the pixel electrode pattern may deteriorate due to the sharp increase in process deviation (since the process deviation 3δ falls outside the 3-sigma control limit).

In the example of FIG. 7A, the NILS value of 2.753 is selected to be a lower threshold value of the exposure quality.

As previously described, when the linewidth of the light blocking pattern in a binary mask increases (while the pitch remains the same), the intensity of light reaching the photoresist layer decreases. This is because less light can pass through the reduced area of the light transmitting portion of the binary mask. As a result of the lower light intensity, the exposure sensitivity and edge intensity may deteriorate, and portions of the photoresist layer on the substrate may not be fully exposed and developed during photolithography. This may impact the quality of the photosensitive pattern and the subsequently formed pixel electrode pattern.

The optical mask embodiments of the inventive concept can address the above problems of low exposure sensitivity and edge intensity in the binary mask. For example, the optical mask embodiments (e.g., of FIG. 1) allow the linewidth of the light blocking pattern to be increased without a corresponding decrease (or deterioration) in exposure sensitivity. This is because light passing through the RIM edge portion of the halftone layer (e.g., halftone layer 20) of the light blocking pattern is diffracted, such that some of the diffracted light may be incident on regions corresponding to the light transmitting portion of the optical mask. The diffracted light increases the intensity of light transmitted through the light transmitting portion of the optical mask, thereby improving exposure sensitivity. In addition to improving exposure sensitivity, the diffracted light from the RIM edge portion of the halftone layer also improves edge intensity. The edge intensity is the intensity of light transmitted toward regions corresponding to the edges of the light blocking pattern of the optical mask.

The table of FIG. 7A provides examples of optical mask embodiments with improved exposure sensitivity, good exposure quality, and low process deviation relative to a binary mask. The selected NILS values meet the criteria of improved exposure sensitivity, quality, etc., without deterioration in process deviation. These selected NILS values are shown in the highlighted boxes in the table of FIG. 7A.

In the example of FIG. 7A, the selected optical mask embodiments include the following RIM sizes of the RIM edge portion of the halftone layer:

RIM size of about 0.1 μm if the linewidth of the light blocking pattern is about 2.4 μm;

RIM sizes ranging from about 0.1 μm to about 0.2 μm if the linewidth of the light blocking pattern is about 2.5 μm;

RIM sizes ranging from about 0.1 μm to about 0.4 μm if the linewidth of the light blocking pattern is about 2.6 μm;

RIM sizes ranging from about 0.1 μm to about 0.5 μm if the linewidth of the light blocking pattern is about 2.7 μm;

RIM sizes ranging from about 0.1 μm to about 0.6 μm if the linewidth of the light blocking pattern is about 2.8 μm;

RIM sizes ranging from about 0.1 μm to about 0.7 μm if the linewidth of the light blocking pattern is about 2.9 μm;

RIM sizes ranging from about 0.1 μm to about 0.9 μm if the linewidth of the light blocking pattern is about 3.0 μm; and RIM sizes ranging from about 0.1 μm to about 1.0 μm if the linewidth of the light blocking pattern is about 3.1 μm.

The table below includes the above results.

| Transmission ratio of the halftone layer (10%); Pitch of the light blocking pattern (6 μm) [see FIG. 7A] | |
| --- | --- |
| Linewidth of the light blocking pattern | RIM size(s) of the RIM edge portion of the halftone layer |
| 2.4 μm | 0.1 μm |
| 2.5 μm | 0.1 μm to 0.2 μm |
| 2.6 μm | 0.1 μm to 0.4 μm |
| 2.7 μm | 0.1 μm to 0.5 μm |
| 2.8 μm | 0.1 μm to 0.6 μm |
| 2.9 μm | 0.1 μm to 0.7 μm |
| 3.0 μm | 0.1 μm to 0.9 μm |
| 3.1 μm | 0.1 μm to 1.0 μm |
| 3.2 μm | 0.1 μm to 1.0 μm |
| 3.3 μm | 0.1 μm to 1.0 μm |
| 3.4 μm | 0.1 μm to 1.0 μm |
| 3.5 μm | 0.1 μm to 1.0 μm |
| 3.6 μm | 0.1 μm to 1.0 μm |
| 3.7 μm | 0.1 μm to 1.0 μm |
| 3.8 μm | 0.1 μm to 1.0 μm |
| 3.9 μm | 0.1 μm to 1.0 μm |
| 4.0 μm | 0.1 μm to 1.0 μm |

The dimensions of the selected optical mask embodiments of FIG. 7A may be obtained with reference to FIG. 1. Referring to FIG. 7A, taking the linewidth of 2.5 μm as an example, an optical mask with RIM sizes of 0.1 μm or 0.2 μm may be used in lieu of a binary mask. Referring to FIG. 1, the linewidth of the light blocking pattern is the same as the linewidth d1 of the halftone layer 20 (i.e., d1=2.5 μm). In an optical mask with a RIM size of 0.2 μm, the width (R) of the RIM edge portion of the halftone layer 20 will be 0.2 μm (i.e., R=0.2 μm). Therefore, the linewidth d3 of the light blocking layer 30 will be 2.1 μm (given by d3=d1−2*R).

Next, FIG. 7B is a table listing the edge intensity values for different linewidths of a light blocking pattern and RIM sizes (R) of a halftone layer (e.g., halftone layer 20), wherein the halftone layer has a transmission ratio of about 10% and the light blocking pattern has a pitch of about 6 μm.

As previously described, the table of FIG. 7A provides examples of optical mask embodiments with improved exposure sensitivity, good exposure quality, and low process deviation relative to a binary mask. Next, edge intensity values corresponding to the selected NILS values (in the table of FIG. 7A) are selected from the table of FIG. 7B. As shown in FIG. 7B, the selected edge intensity values include edge intensity values for RIM sizes ranging from 0.1 μm to 1.0 μm at different linewidths of the light blocking pattern. For example, an edge intensity value of 0.336 is selected corresponding to a RIM size of 0.1 μm, linewidth of 2.4 μm, and NILS value of 2.753.

As previously described with reference to FIGS. 6A to 6E, at each linewidth of the light blocking pattern, the edge intensity value increases as the RIM size increases. This is due to the higher amount of diffracted light for a larger RIM size. For example, a RIM edge portion with a RIM size of 0.2 μm has a higher amount of diffracted light compared to a RIM edge portion with a RIM size of 0.1 μm. The diffracted light from the RIM edge portion of the halftone layer can improve exposure sensitivity and edge intensity by increasing the amount of light transmitting through the light transmitting portion of the optical mask.

In contrast, a binary mask having an equivalent linewidth (i.e., same linewidth as the optical mask embodiments) allows relatively less light to transmit through the light transmitting portion of the binary mask. As a result, the binary mask has lower exposure sensitivity and edge intensity.

As a result of the improved exposure sensitivity and edge intensity, the selected optical mask embodiments of FIGS. 7A and 7B allow the linewidth/spacing of a pixel electrode pattern to be further reduced compared to a binary mask, without deterioration in process deviation and/or impact to the quality of the photosensitive pattern and pixel electrode pattern.

FIG. 8A is a table listing the NILS values for different linewidths of a light blocking pattern and RIM sizes (R) of a halftone layer (e.g., halftone layer 20), wherein the halftone layer has a transmission ratio of about 20% and the light blocking pattern has a pitch of about 6 μm. In the example of FIG. 8A, the NILS value of 2.753 is selected to be a lower threshold value of the exposure quality.

The table of FIG. 8A provides further examples of optical mask embodiments with improved exposure sensitivity, good exposure quality, and low process deviation relative to a binary mask. The selected NILS values meet the criteria of improved exposure sensitivity, quality, etc., without deterioration in process deviation. These selected NILS values are shown in the highlighted boxes in the table of FIG. 8A.

In the example of FIG. 8A, the selected optical mask embodiments include the following RIM sizes of the RIM edge portion of the halftone layer:

RIM size of about 0.1 μm if the linewidth of the light blocking pattern is about 2.5 μm;

RIM sizes ranging from about 0.1 μm to about 0.3 μm if the linewidth of the light blocking pattern is about 2.6 μm; RIM sizes ranging from about 0.1 μm to about 0.4 μm if the linewidth of the light blocking pattern is about 2.7 μm;

RIM sizes ranging from about 0.1 μm to about 0.5 μm if the linewidth of the light blocking pattern is about 2.8 μm;

RIM sizes ranging from about 0.1 μm to about 0.5 μm if the linewidth of the light blocking pattern is about 2.9 μm;

RIM sizes ranging from about 0.1 μm to about 0.6 μm if the linewidth of the light blocking pattern is about 3.0 μm; and RIM sizes ranging from about 0.1 μm to about 0.7 μm if the linewidth of the light blocking pattern is about 3.1 μm.

The table below includes the above results.

| Linewidth of the light blocking pattern | RIM size(s) of the edge portion of the halftone layer |
| --- | --- |
| Transmission ratio of the halftone layer (20%); Pitch of the light blocking pattern (6 μm) [see FIG. 8A] | |
| 2.5 μm | 0.1 μm |
| 2.6 μm | 0.1 μm to 0.3 μm |
| 2.7 μm | 0.1 μm to 0.4 μm |
| 2.8 μm | 0.1 μm to 0.5 μm |
| 2.9 μm | 0.1 μm to 0.5 μm |
| 3.0 μm | 0.1 μm to 0.6 μm |
| 3.1 μm | 0.1 μm to 0.7 μm |
| 3.2 μm | 0.1 μm to 0.8 μm |
| 3.3 μm | 0.1 μm to 0.8 μm |
| 3.4 μm | 0.1 μm to 0.9 μm |
| 3.5 μm | 0.1 μm to 0.9 μm |
| 3.6 μm | 0.1 μm to 1.0 μm |
| 3.7 μm | 0.1 μm to 1.0 μm |
| 3.8 μm | 0.1 μm to 1.0 μm |
| 3.9 μm | 0.1 μm to 1.0 μm |
| 4.0 μm | 0.1 μm to 1.0 μm |

The dimensions of the selected optical mask embodiments of FIG. 8A may be obtained with reference to FIG. 1. Referring to FIG. 8A, taking the linewidth of 2.6 μm as an example, optical masks with RIM sizes of 0.1 μm, 0.2 μm, or 0.3 μm may be used in lieu of a binary mask. Referring to FIG. 1, the linewidth of the light blocking pattern is the same as the linewidth d1 of the halftone layer 20 (i.e., d1=2.6 μm). In an optical mask with a RIM size of 0.2 μm, the width (R) of the RIM edge portion of the halftone layer 20 will be 0.2 μm (i.e., R=0.2 μm). Therefore, the linewidth d3 of the light blocking layer 30 will be 2.2 μm (given by d3=d1−2*R). Next, FIG. 8B is a table listing the edge intensity values for different linewidths of a light blocking pattern and RIM sizes (R) of a halftone layer (e.g., halftone layer 20), wherein the halftone layer 20 has a transmission ratio of about 20% and the light blocking pattern has a pitch of about 6 μm.

As previously described, the table of FIG. 8A provides examples of optical mask embodiments with improved exposure sensitivity, good exposure quality, and low process deviation relative to a binary mask. Next, edge intensity values corresponding to the selected NILS values (in the table of FIG. 8A) are selected from the table of FIG. 8B. As shown in FIG. 8B, the selected edge intensity values include edge intensity values for RIM sizes ranging from 0.1 μm to 1.0 μm at different linewidths of the light blocking pattern. For example, an edge intensity value of 0.342 is selected corresponding to a RIM size of 0.1 μm, linewidth of 2.5 μm, and NILS value of 2.849.

As a result of the improved exposure sensitivity and edge intensity, the selected optical mask embodiments of FIGS. 8A and 8B allow the linewidth/spacing of a pixel electrode pattern to be further reduced compared to a binary mask, without deterioration in process deviation and/or impact to the quality of the photosensitive pattern and pixel electrode pattern.

FIG. 9A is a table listing the NILS values for different linewidths of a light blocking pattern and RIM sizes (R) of a halftone layer (e.g., halftone layer 20), wherein the halftone layer has a transmission ratio of about 30% and the light blocking pattern has a pitch of about 6 μm. In the example of FIG. 9A, the NILS value of 2.753 is selected to be a lower threshold value of the exposure quality.

The table of FIG. 9A provides further examples of optical mask embodiments with improved exposure sensitivity, good exposure quality, and low process deviation relative to a binary mask. The selected NILS values meet the criteria of improved exposure sensitivity, quality, etc., without deterioration in process deviation. These selected NILS values are shown in the highlighted boxes in the table of FIG. 9A.

In the example of FIG. 9A, the selected optical mask embodiments include the following RIM sizes of the RIM edge portion of the halftone layer:

RIM size of about 0.1 μm if the linewidth of the light blocking pattern is about 2.5 μm;

RIM size ranging from about 0.1 μm to about 0.2 μm if the linewidth of the light blocking pattern is about 2.6 μm;

RIM size ranging from about 0.1 μm to about 0.3 μm if the linewidth of the light blocking pattern is about 2.7 μm;

RIM size ranging from about 0.1 μm to about 0.4 μm if the linewidth of the light blocking pattern is about 2.8 μm;

RIM size ranging from about 0.1 μm to about 0.4 μm if the linewidth of the light blocking pattern is about 2.9 μm;

RIM size ranging from about 0.1 μm to about 0.5 μm if the linewidth of the light blocking pattern is about 3.0 μm; and RIM size ranging from about 0.1 μm to about 0.6 μm if the linewidth of the light blocking pattern is about 3.1 μm.

The table below includes the above results.

| Linewidth of the light blocking pattern | RIM size(s) of the edge portion of the halftone layer |
| --- | --- |
| Transmission ratio of the halftone layer (30%); Pitch of the light blocking pattern (6 μm) [see FIG. 9A] | |
| 2.5 μm | 0.1 μm |
| 2.6 μm | 0.1 μm to 0.2 μm |
| 2.7 μm | 0.1 μm to 0.3 μm |
| 2.8 μm | 0.1 μm to 0.4 μm |
| 2.9 μm | 0.1 μm to 0.4 μm |
| 3.0 μm | 0.1 μm to 0.5 μm |
| 3.1 μm | 0.1 μm to 0.6 μm |
| 3.2 μm | 0.1 μm to 0.6 μm |
| 3.3 μm | 0.1 μm to 0.7 μm |
| 3.4 μm | 0.1 μm to 0.7 μm |
| 3.5 μm | 0.1 μm to 0.8 μm |
| 3.6 μm | 0.1 μm to 0.8 μm |
| 3.7 μm | 0.1 μm to 0.9 μm |
| 3.8 μm | 0.1 μm to 0.9 μm |
| 3.9 μm | 0.1 μm to 0.9 μm |
| 4.0 μm | 0.1 μm to 0.9 μm |

The dimensions of the selected optical mask embodiments in FIG. 9A may be obtained with reference to FIG. 1. Referring to FIG. 9A, taking the linewidth of 2.7 μm as an example, optical masks with RIM sizes of 0.1 μm, 0.2 μm, or 0.3 μm may be used in lieu of a binary mask. Referring to FIG. 1, the linewidth of the light blocking pattern is the same as the linewidth d1 of the halftone layer 20 (i.e., d1=2.7 μm). In an optical mask with a RIM size of 0.2 μm, the width (R) of the RIM edge portion of the halftone layer 20 will be 0.2 μm (i.e., R=0.2 μm). Therefore, the linewidth d3 of the light blocking layer 30 will be 2.3 μm (given by d3=d1−2*R).

Next, FIG. 9B is a table listing the edge intensity values for different linewidths of a light blocking pattern and RIM sizes (R) of a halftone layer (e.g., halftone layer 20), wherein the halftone layer 20 has a transmission ratio of about 30% and the light blocking pattern has a pitch of about 6 μm.

As previously described, the table of FIG. 9A provides examples of optical mask embodiments with improved exposure sensitivity, good exposure quality, and low process deviation relative to a binary mask. Next, edge intensity values corresponding to the selected NILS values (in the table of FIG. 9A) are selected from the table of FIG. 9B. As shown in FIG. 9B, the selected edge intensity values include edge intensity values for RIM sizes ranging from 0.1 μm to 0.9 μm at different linewidths. For example, an edge intensity value of 0.345 is selected corresponding to a RIM size of 0.1 μm, linewidth of 2.5 μm, and NILS value of 2.828.

As a result of the improved exposure sensitivity and edge intensity, the selected optical mask embodiments of FIGS. 9A and 9B allow the linewidth/spacing of a pixel electrode pattern to be further reduced compared to a binary mask, without deterioration in process deviation and/or impact to the quality of the photosensitive pattern and pixel electrode pattern.

FIG. 10A is a table listing the NILS values for different linewidths of a light blocking pattern and RIM sizes (R) of a halftone layer (e.g., halftone layer 20), wherein the halftone layer has a transmission ratio of about 40% and the light blocking pattern has a pitch of about 6 μm. In the example of FIG. 10A, the NILS value of 2.753 is selected to be a lower threshold value of the exposure quality.

The table of FIG. 10A provides further examples of optical mask embodiments with improved exposure sensitivity, good exposure quality, and low process deviation relative to a binary mask. The selected NILS values meet the criteria of improved exposure sensitivity, quality, etc., without deterioration in process deviation. These selected NILS values are shown in the highlighted boxes in the table of FIG. 10A.

In the example of FIG. 10A, the selected optical mask embodiments include the following RIM sizes of the RIM edge portion of the halftone layer:

RIM size of about 0.1 μm if the linewidth of the light blocking pattern is about 2.5 μm;

RIM sizes ranging from about 0.1 μm to about 0.2 μm if the linewidth of the light blocking pattern is about 2.6 μm;

RIM sizes ranging from about 0.1 μm to about 0.3 μm if the linewidth of the light blocking pattern is about 2.7 μm;

RIM sizes ranging from about 0.1 μm to about 0.3 μm if the linewidth of the light blocking pattern is about 2.8 μm;

RIM sizes ranging from about 0.1 μm to about 0.4 μm if the linewidth of the light blocking pattern is about 2.9 μm;

RIM sizes ranging from about 0.1 μm to about 0.5 μm if the linewidth of the light blocking pattern is about 3.0 μm; and RIM sizes ranging from about 0.1 μm to about 0.5 μm if the linewidth of the light blocking pattern is about 3.1 μm.

The table below includes the above results.

| Transmission ratio of the halftone layer (about 40%); Pitch of the light blocking pattern (about 6 μm) [see FIG. 10A] ||
| --- | --- |
| Linewidth of the light blocking pattern | RIM size(s) of the edge portion of the halftone layer |
| 2.5 μm | 0.1 μm |
| 2.6 μm | 0.1 μm to 0.2 μm |
| 2.7 μm | 0.1 μm to 0.3 μm |
| 2.8 μm | 0.1 μm to 0.3 μm |
| 2.9 μm | 0.1 μm to 0.4 μm |
| 3.0 μm | 0.1 μm to 0.5 μm |
| 3.1 μm | 0.1 μm to 0.5 μm |
| 3.2 μm | 0.1 μm to 0.6 μm |
| 3.3 μm | 0.1 μm to 0.6 μm |
| 3.4 μm | 0.1 μm to 0.7 μm |
| 3.5 μm | 0.1 μm to 0.7 μm |
| 3.6 μm | 0.1 μm to 0.7 μm |
| 3.7 μm | 0.1 μm to 0.8 μm |
| 3.8 μm | 0.1 μm to 0.8 μm |
| 3.9 μm | 0.1 μm to 0.8 μm |
| 4.0 μm | 0.1 μm to 0.8 μm |

The dimensions of the selected optical mask embodiments in FIG. 10A may be obtained with reference to FIG. 1. Referring to FIG. 10A, taking the linewidth of 2.8 μm as an example, optical masks with RIM sizes of 0.1 μm, 0.2 μm, or 0.3 μm may be used in lieu of a binary mask. Referring to FIG. 1, the linewidth of the light blocking pattern is the same as the linewidth d1 of the halftone layer 20 (i.e., d1=2.8 μm). In an optical mask with a RIM size of 0.2 μm, the width (R) of the RIM edge portion of the halftone layer 20 will be 0.2 μm (i.e., R=0.2 μm). Therefore, the linewidth d3 of the light blocking layer 30 will be 2.4 μm (given by d3=d1−2*R).

Next, FIG. 10B is a table listing the edge intensity values for different linewidths of the light blocking pattern and RIM sizes (R) of the halftone layer (e.g., halftone layer 20), wherein the halftone layer 20 has a transmission ratio of about 40% and the light blocking pattern has a pitch of about 6 μm.

As previously described, the table of FIG. 10A provides examples of optical mask embodiments with improved exposure sensitivity, good exposure quality, and low process deviation relative to a binary mask. Next, edge intensity values corresponding to the selected NILS values (in the table of FIG. 10A) are selected from the table of FIG. 10B. As shown in FIG. 10B, the selected edge intensity values include edge intensity values for RIM sizes ranging from 0.1 μm to 0.8 μm at different linewidths of the light blocking pattern. For example, an edge intensity value of 0.349 is selected corresponding to a RIM size of 0.1 μm, linewidth of 2.5 μm, and NILS value of 2.811.

As a result of the improved exposure sensitivity and edge intensity, the selected optical mask embodiments of FIGS. 10A and 10B allow the linewidth/spacing of a pixel electrode pattern to be further reduced compared to a binary mask, without deterioration in process deviation and/or impact to the quality of the photosensitive pattern and pixel electrode pattern.

FIG. 11A is a table listing the NILS values for different linewidths of a light blocking pattern and RIM sizes (R) of a halftone layer (e.g., halftone layer 20), wherein the halftone layer has a transmission ratio of about 50% and the light blocking pattern has a pitch of about 6 μm. In the example of FIG. 11A, the NILS value of 2.753 is selected to be a lower threshold value of the exposure quality.

The table of FIG. 11A provides further examples of optical mask embodiments with improved exposure sensitivity, good exposure quality, and low process deviation relative to a binary mask. The selected NILS values meet the criteria of improved exposure sensitivity, quality, etc., without deterioration in process deviation. These selected NILS values are shown in the highlighted boxes in the table of FIG. 11A.

In the example of FIG. 11A, the selected optical mask embodiments include the following RIM sizes of the RIM edge portion of the halftone layer:

RIM size of about 0.1 µm if the linewidth of the light blocking pattern is about 2.5 µm;

RIM sizes ranging from about 0.1 µm to about 0.2 µm if the linewidth of the light blocking pattern is about 2.6 µm;

RIM sizes ranging from about 0.1 µm to about 0.2 µm if the linewidth of the light blocking pattern is about 2.7 µm;

RIM sizes ranging from about 0.1 µm to about 0.3 µm if the linewidth of the light blocking pattern is about 2.8 µm;

RIM sizes ranging from about 0.1 µm to about 0.3 µm if the linewidth of the light blocking pattern is about 2.9 µm;

RIM sizes ranging from about 0.1 µm to about 0.4 µm if the linewidth of the light blocking pattern is about 3.0 µm; and RIM sizes ranging from about 0.1 µm to about 0.5 µm if the linewidth of the light blocking pattern is about 3.1 µm.

The table below includes the above results.

| Transmission ratio of the halftone layer (about 50%); Pitch of the light blocking pattern (about 6 µm) [see FIG. 11A] ||
| --- | --- |
| Linewidth of the light blocking pattern | RIM size(s) of the edge portion of the halftone layer |
| 2.5 µm | 0.1 µm |
| 2.6 µm | 0.1 µm to 0.2 µm |
| 2.7 µm | 0.1 µm to 0.2 µm |
| 2.8 µm | 0.1 µm to 0.3 µm |
| 2.9 µm | 0.1 µm to 0.3 µm |
| 3.0 µm | 0.1 µm to 0.4 µm |
| 3.1 µm | 0.1 µm to 0.5 µm |
| 3.2 µm | 0.1 µm to 0.5 µm |
| 3.3 µm | 0.1 µm to 0.6 µm |
| 3.4 µm | 0.1 µm to 0.6 µm |
| 3.5 µm | 0.1 µm to 0.6 µm |
| 3.6 µm | 0.1 µm to 0.7 µm |
| 3.7 µm | 0.1 µm to 0.7 µm |
| 3.8 µm | 0.1 µm to 0.7 µm |
| 3.9 µm | 0.1 µm to 0.7 µm |
| 4.0 µm | 0.1 µm to 0.7 µm |

The dimensions of the selected optical mask embodiments in FIG. 11A may be obtained with reference to FIG. 1. Referring to FIG. 11A, taking the linewidth of 2.9 µm as an example, optical masks with RIM sizes of 0.1 µm, 0.2 µm, or 0.3 µm may be used in lieu of a binary mask. Referring to FIG. 1, the linewidth of the light blocking pattern is the same as the linewidth d1 of the halftone layer 20 (i.e., d1=2.9 µm). In an optical mask with a RIM size of 0.2 µm, the width (R) of the RIM edge portion of the halftone layer 20 will be 0.2 µm (i.e., R=0.2 µm). Therefore, the linewidth d3 of the light blocking layer 30 will be 2.5 µm (given by d3=d1−2*R). Next, FIG. 11B is a table listing the edge intensity values for different linewidths of a light blocking pattern and RIM sizes (R) of a halftone layer (e.g., halftone layer 20), wherein the halftone layer 20 has a transmission ratio of about 50% and the light blocking pattern has a pitch of about 6 µm.

As previously described, the table of FIG. 11A provides examples of optical mask embodiments with improved exposure sensitivity, good exposure quality, and low process deviation relative to a binary mask. Next, edge intensity values corresponding to the selected NILS values (in the table of FIG. 11A) are selected from the table of FIG. 11B. As shown in FIG. 11B, the selected edge intensity values include edge intensity values for RIM sizes ranging from 0.1 µm to 0.7 µm at different linewidths of the light blocking pattern. For example, an edge intensity value of 0.352 is selected corresponding to a RIM size of 0.1 µm, linewidth of 2.5 µm, and NILS value of 2.795.

As a result of the improved exposure sensitivity and edge intensity, the selected optical mask embodiments of FIGS. 11A and 11B allow the linewidth/spacing of a pixel electrode pattern to be further reduced compared to a binary mask, without deterioration in process deviation and/or impact to the quality of the photosensitive pattern and pixel electrode pattern.

In summary, as previously described with reference to FIGS. 7A to 11B, when the pitch of the light blocking pattern of the optical mask is about 6 µm, different RIM sizes of the halftone layer 20 of the light blocking pattern in different optical mask embodiments can be selected from each table for different transmission ratios (ranging from about 10% to about 50%). For each linewidth of the light blocking pattern, the selected RIM sizes allow the edge intensity and exposure sensitivity to be improved (while maintaining good exposure quality) relative to a binary mask.

As previously described with reference to FIGS. 7A to 11B, when the transmission ratio increases from about 10% to about 50%, conditions exist in which the edge intensity and exposure sensitivity can be improved without deterioration in process deviation.

In some embodiments (not shown), the RIM sizes of the halftone layer (that allow exposure sensitivity and edge intensity to be improved without deterioration in process deviation), may range from about 0.1 µm to more than 1.0 µm.

As shown in FIGS. 7B, 8B, 9B, 10B and 11B, the selected edge intensity values are greater than the corresponding edge intensity values of the binary mask at each linewidth of the light blocking pattern (where applicable).

Although the optical mask embodiments in FIGS. 7A to 11B are based on the light blocking pattern having a pitch of about 6 µm, the inventive concept is not limited thereto. For example, the pitch of the light blocking pattern may be different in other embodiments. Nevertheless, the linewidths of the light blocking pattern and RIM sizes of the halftone layer of the light blocking pattern may be appropriately adjusted in those other embodiments.

While the inventive concept has been described with reference to certain embodiments, it is to be understood that the inventive concept is not limited to the disclosed embodiments. Instead, the present disclosure is intended to cover various modifications and equivalent arrangements included within the spirit and scope of the inventive concept.

What is claimed is:

1. An optical mask for forming a pattern, comprising:
a substrate including a light blocking pattern formed on portions of the substrate,
wherein the light blocking pattern includes a halftone layer and a light blocking layer formed on the halftone layer, and
wherein the halftone layer and the light blocking layer overlap, and a linewidth of the halftone layer is greater than a linewidth of the light blocking layer such that at least an edge portion of the halftone layer is exposed.

2. The optical mask of claim 1, wherein the halftone layer is disposed between the substrate and the light blocking layer.

3. The optical mask of claim 1, wherein the substrate is formed of a transparent insulating material.

4. The optical mask of claim 1, wherein the light blocking layer is formed of an opaque material.

5. The optical mask of claim 1, wherein the halftone layer is configured to transmit portions of light passing through the substrate.

6. The optical mask of claim 1, wherein the halftone layer includes at least one of Mo, Si, Ta, W, Al, Cr, Hf, Zr, Me, V, Ni, Nb, Co, or Ti.

7. The optical mask of claim 6, wherein the portions of light passing through the substrate at the edge portion of the halftone layer undergo diffraction.

8. The optical mask of claim 6, wherein the halftone layer further includes at least one of COx, Ox, or Nx (where x is a natural number).

9. The optical mask of claim 1, wherein the linewidth of the halftone layer corresponds to a linewidth of the light blocking pattern.

10. The optical mask of claim 9, wherein the light blocking pattern is formed having a predetermined pitch.

11. The optical mask of claim 10, wherein the pitch of the light blocking pattern is about 6 μm, and the linewidth of the light blocking pattern ranges from about 3.2 μm to about 3.7 μm.

12. The optical mask of claim 1, wherein a transmission ratio of the halftone layer ranges from about 10% to about 50%, and a width of the edge portion of the halftone layer ranges from about 0.1 μm to about 1.0 μm.

13. The optical mask of claim 12, wherein an NILS (Normalized Image Log Slope) value of the optical mask decreases as the width of the edge portion of the halftone layer increases.

14. The optical mask of claim 13, wherein the NILS value of the optical mask decreases more rapidly as the transmission ratio of the halftone layer increases.

15. The optical mask of claim 14, wherein for a predetermined width of the edge portion of the halftone layer:
the NILS value at a first transmission ratio is lower than the NILS value at a second transmission ratio, wherein the second transmission ratio is lower than the first transmission ratio.

16. The optical mask of claim 12, wherein an edge intensity value of the optical mask increases as the width of the edge portion of the halftone layer increases.

17. The optical mask of claim 16, wherein the edge intensity value of the optical mask increases more rapidly as the transmission ratio of the halftone layer increases.

18. The optical mask of claim 17, wherein for a predetermined width of the edge portion of the halftone layer:
the edge intensity value at a first transmission ratio is greater than the edge intensity value at a second transmission ratio, wherein the second transmission ratio is lower than the first transmission ratio.

19. The optical mask of claim 13, wherein the NILS (Normalized Image Log Slope) value of the optical mask is preferably greater than about 2.753.

* * * * *